United States Patent
Takaike

(10) Patent No.: US 7,718,900 B2
(45) Date of Patent: May 18, 2010

(54) ELECTRONIC PARTS PACKAGING STRUCTURE AND METHOD OF MANUFACTURING THE SAME

(75) Inventor: Eiji Takaike, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 540 days.

(21) Appl. No.: 11/298,675

(22) Filed: Dec. 12, 2005

(65) Prior Publication Data

US 2006/0124347 A1   Jun. 15, 2006

(30) Foreign Application Priority Data

Dec. 15, 2004   (JP)   ............... 2004-362568
Sep. 14, 2005   (JP)   ............... 2005-266903

(51) Int. Cl.
    *H05K 1/00* (2006.01)
(52) U.S. Cl. .................. 174/254; 361/760; 361/761; 361/767; 361/749; 361/750
(58) Field of Classification Search .......... 361/760, 361/761, 763–765, 767, 768, 782, 783, 790–795, 361/748, 749, 750, 751; 174/260–267, 254; 257/678–730
See application file for complete search history.

(56) References Cited

U.S. PATENT DOCUMENTS

| | | | |
|---|---|---|---|
| 5,270,493 A * | 12/1993 | Inoue et al. | 174/253 |
| 6,225,688 B1 * | 5/2001 | Kim et al. | 257/686 |
| 6,717,250 B1 * | 4/2004 | Emoto | 257/686 |
| 7,071,547 B2 * | 7/2006 | Kang et al. | 257/686 |
| 7,149,095 B2 * | 12/2006 | Warner et al. | 361/803 |
| 2001/0040793 A1 * | 11/2001 | Inaba | 361/749 |
| 2002/0180022 A1 * | 12/2002 | Emoto | 257/686 |
| 2003/0006069 A1 * | 1/2003 | Takebe et al. | 174/263 |
| 2003/0090883 A1 * | 5/2003 | Asahi et al. | 361/761 |
| 2005/0275088 A1 * | 12/2005 | Sakurai et al. | 257/723 |

FOREIGN PATENT DOCUMENTS

| | | |
|---|---|---|
| JP | 09-283925 | 10/1997 |
| JP | 2003-318323 | 11/2003 |

\* cited by examiner

*Primary Examiner*—Dameon E Levi
*Assistant Examiner*—Hoa C Nguyen
(74) *Attorney, Agent, or Firm*—Edwards Angell Palmer & Dodge LLP

(57) ABSTRACT

An electronic parts packaging structure including an insulating layer acting as a flexible substrate, an electronic parts buried in the insulating layer in a state that a whole electronic parts is covered with the insulating layer, and a wiring layer buried in the insulating layer and connected electrically to a connection pad of the electronic parts. A structure body in which a plurality of electronic parts are buried in the insulating layer may be folded and electronic parts may be connected electrically.

6 Claims, 23 Drawing Sheets

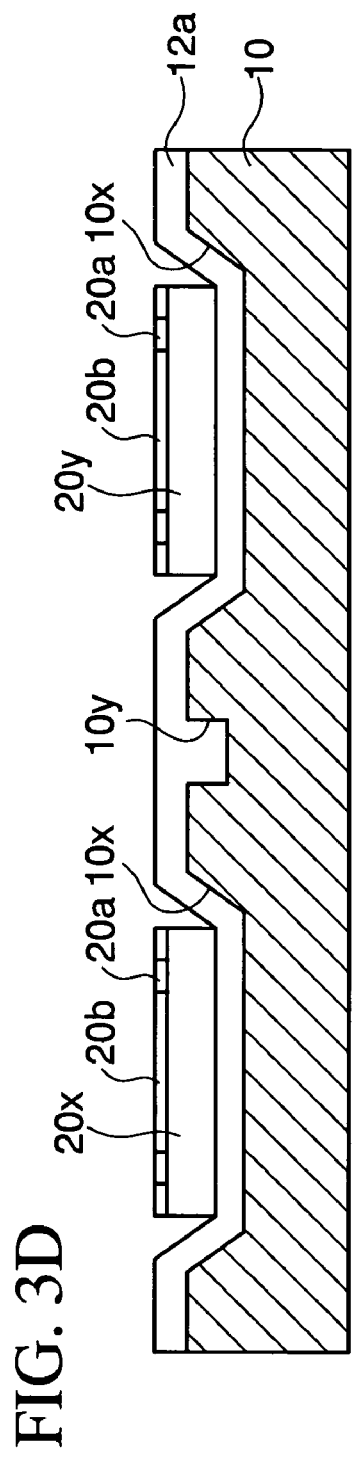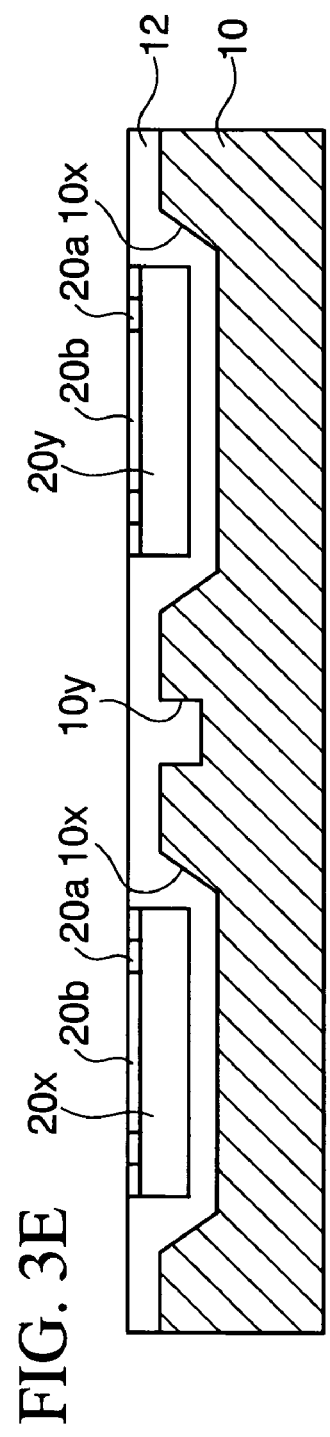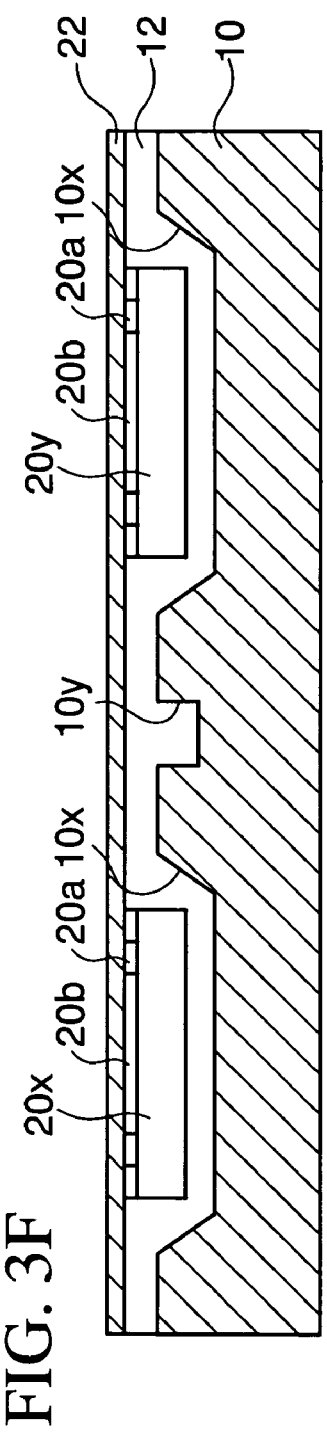

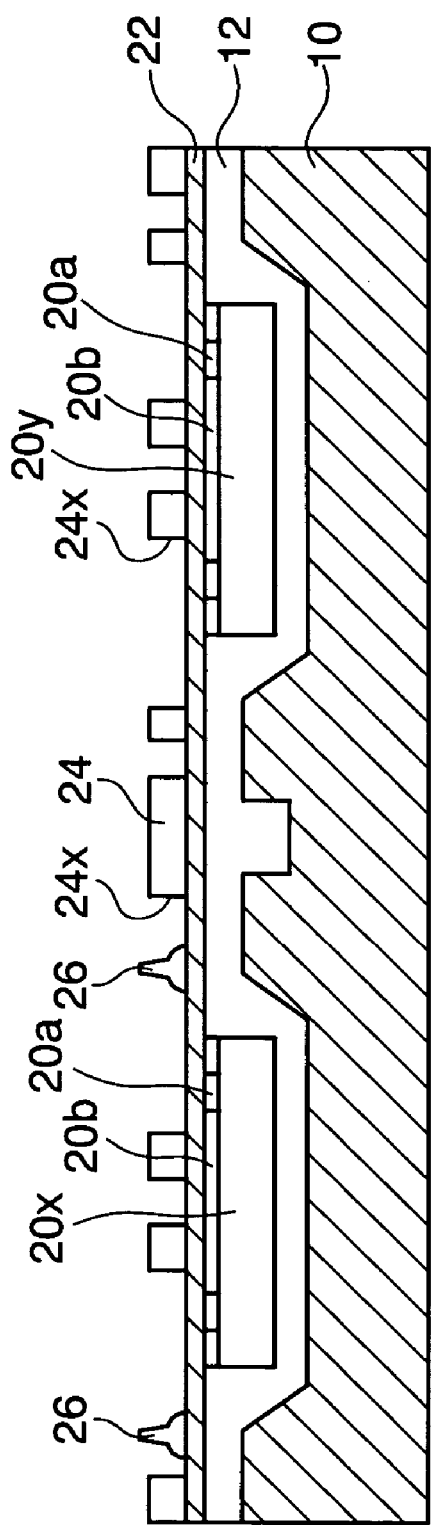
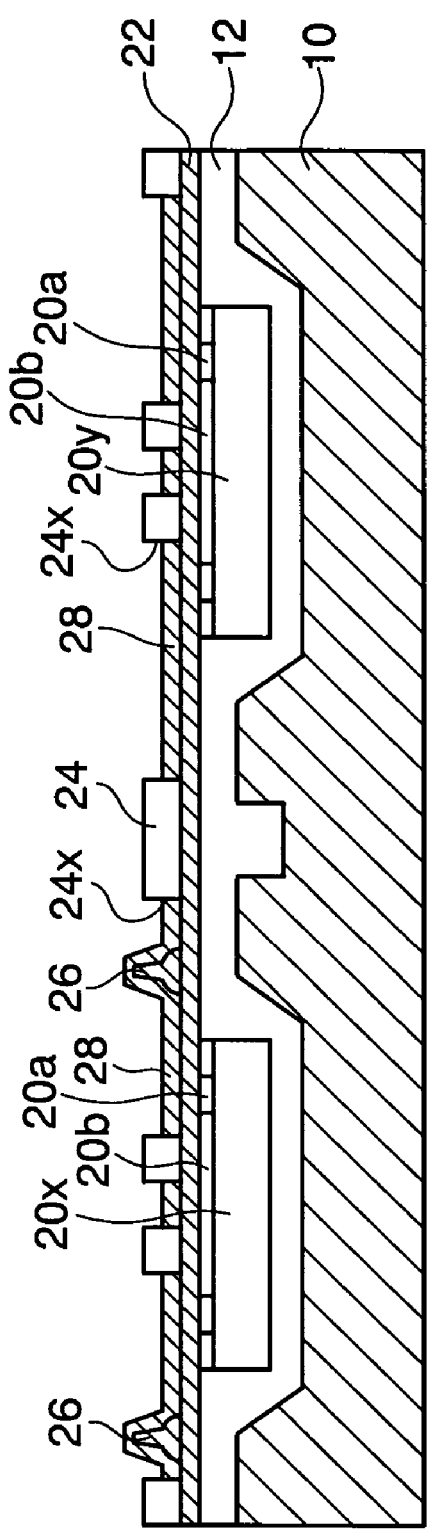

ELECTRONIC PARTS PACKAGING STRUCTURE AND METHOD OF MANUFACTURING THE SAME

CROSS-REFERENCE TO RELATED APPLICATIONS

This application is based on and claims priority in Japanese Patent Application No. 2004-362568 filed on Dec. 15, 2004, and No. 2005-266903 filed on Sep. 14, 2005, the entire contents of which are incorporated herein by reference.

BACKGROUND OF THE INVENTION

1. Field of the Invention

The present invention relates to an electronic parts packaging structure and a method of manufacturing the same and, more particularly, to an electronic parts packaging structure in which an electronic part such as a semiconductor chip, or the like is mounted in a state that such electronic part is buried in an insulating layer and a method of manufacturing the same.

2. Description of the Related Art

In the prior art, there exists the electronic parts packaging structure (such as the semiconductor device, or the like) having a structure in which the electronic parts such as the semiconductor chip, or the like is mounted in a state that such electronic part is buried in the insulating layer. As an example of the electronic parts packaging structure manufacturing method, first the semiconductor chip is adhered onto the base substrate made of a glass epoxy resin, or the like by the adhesive layer, and then the semiconductor chip is covered with the insulating layer (the epoxy resin layer, or the like). Then, wiring layers that are connected to connection pads of the semiconductor chip via the via holes provided in the resin layer are formed on the resin layer.

In Patent Literature 1 (Patent Application Publication (KOKAI) 2003-318323), it is set forth that the semiconductor chip and wiring layers connected thereto are formed on the base substrate in such a fashion that they are buried in the insulating layer and then the base substrate is removed, whereby the electronic parts packaging structure having such a structure that the semiconductor chip is buried in the insulating layer to expose its back surface can be obtained.

Also, in Patent Literature 2 (Patent Application Publication (KOKAI) Hei 9-283925), the electronic parts packaging structure having such a structure that the semiconductor chip is mounted on the wiring layers, which are provided on the insulating layer (photosensitive resin) as the core substrate, to be connected to the wiring layers via the wires and then the semiconductor chip is sealed with the epoxy resin is set forth.

In recent years, the flexible electronic parts packaging structure that is easy to be mounted is requested. However, in the prior art, it is impossible to say that the material combination is optimized. A thermal stress resulting from a difference in the thermal expansion coefficient between the semiconductor chip (silicon chip) and the core substrate or the insulating layer is ready to occur. Accordingly, there is the problem that a warp is likely to occur in the electronic parts packaging structure. Thus, it is difficult to manufacture the flexible electronic parts packaging structure with high reliability. Therefore, a method capable of forming easily the flexible electronic parts packaging structure with high reliability is demanded. In Patent Literatures 1 and 2, no consideration is given at all to how the flexible electronic parts packaging structure should be manufactured with good reliability.

SUMMARY OF THE INVENTION

It is an object of the present invention to provide a flexible electronic parts packaging structure with high reliability, capable of suppressing generation of a warp therein and a method of manufacturing the same.

The present invention is concerned with an electronic parts packaging structure, which includes an insulating layer acting as a flexible substrate; an electronic parts buried in the insulating layer in a state such that a whole of the electronic parts is covered with the insulating layer; and a wiring layer buried in the insulating layer and connected electrically to a connection pad of the electronic parts.

In the electronic parts packaging structure of the present invention, the insulating layer functions as the flexible insulating substrate, and a whole of the electronic parts (the semiconductor chip, the capacitor, the module parts, or the like) is covered with the insulating layer and is mounted. Also, the wiring layer connected electrically to the connection pads of the electronic parts is buried in the insulating layer.

In one preferred mode of the present invention, the insulating layer is composed of a first insulating layer and a second insulating layer made of same material such as a polyimide resin, or the like, for example, and the electronic parts is arranged between the first insulating layer and the second insulating layer in a state that the connection pad of the electronic parts is directed upward. Also, it is preferable that the electronic parts is are buried in the first insulating layer such that a level difference of the electronic parts is planarized.

In the electronic parts packaging structure of the present invention, because the electronic parts (e.g., the semiconductor (silicon) chip) is buried in the first and second insulating layers (e.g., polyimide resin) a thermal expansion coefficient of which closely resembles the electronic parts, generation of the warp due to the thermal stress can be suppressed. In addition, because the insulating layers made of the same material are formed on the whole outer surface side (both surface sides, all side surface sides) of the electronic parts, the thermal stress can be cancelled mutually even when such stress is generated.

Also, because the electronic parts is buried in the polyimide resin, or the like that has rigidity while still keeping flexibility and is mounted, such packaging structure can also be mounted even in a situation that the substrate is curved intentionally. Therefore, the packaging structure in which two electronic parts, for example, are buried in the insulating layer in parallel in the horizontal direction is folded, thereby the wiring layers connected to two electronic parts also can be connected mutually and be packaged. As a result, an area of the electronic parts packaging structure can be reduced remarkably rather than the case where two semiconductor chips are mounted in parallel in the horizontal direction, and thus the small-sized flexible electronic parts packaging structure can be readily obtained.

Further, because the electronic parts is mounted in the flexible insulating layer, such electronic parts can be mounted directly on the enclosure (the case, or the like) of the electronic device other than the mounting substrate of the electronic device. In this case, predetermined wiring layers are provided to the enclosure of the electronic device, and then the external connection terminals of the electronic parts packaging structure of the present invention are connected electrically to the wiring layers of the enclosure by the plug-in mounting.

Also, the present invention is concerned with a method of manufacturing an electronic parts packaging structure, which includes the steps of forming a semi-cured first insulating layer on a metal plate; arranging an electronic parts on the first insulating layer; adhering the electronic parts to the first insulating layer by curing the first insulating layer by a heat treatment; forming a wiring layer, which is connected electrically to the electronic parts, on the electronic parts and the first insulating layer; forming a second insulating layer that is made of same material as the first insulating layer and covers the electronic parts and the wiring layer; and removing selectively the metal plate from the first insulating layer.

In a preferred mode of the present invention, a cavity is provided on an upper surface side of the metal plate, the electronic parts is arranged on the first insulating layer on a bottom portion of the cavity in the step of adhering the electronic parts onto the first insulating layer, and the first insulating layer is cured in a fluidized state and a level difference on the electronic parts is planarized by a fluidization of the first insulating layer in the step of adhering the electronic parts onto the first insulating layer.

According to such manufacturing method, the electronic parts packaging structure having the above structure can be easily manufactured. In addition, since the electronic parts is adhered onto the insulating layer in curing the semi-cured insulating layer, there is no necessity to use the adhesive layer particularly. Therefore, from such a viewpoint that the adhesive layer whose thermal expansion coefficient is different from the electronic parts is not left in the packaging structure, generation of the warp of the packaging structure can be prevented.

As described above, according to the present invention, the flexible electronic parts packaging structure with high reliability can be provided.

DETAILED DESCRIPTION OF THE PREFERRED EMBODIMENTS

Embodiments of the present invention will be explained with reference to the accompanying drawings hereinafter.

First Embodiment

FIGS. 1A to 1J are sectional views showing a method of manufacturing an electronic parts packaging structure according to a first embodiment of the present invention.

Figure 1A:
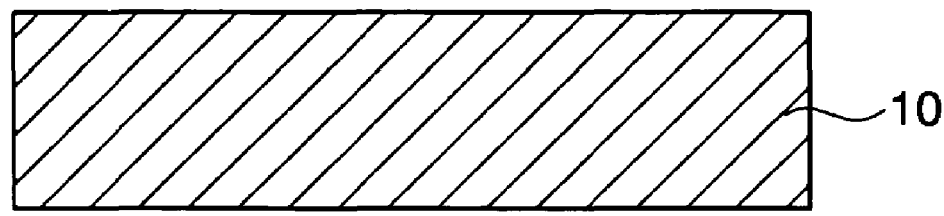
FIGS. 1A to 1J are sectional views showing a method of manufacturing an electronic parts packaging structure according to a first embodiment of the present invention.
Figure 1B:
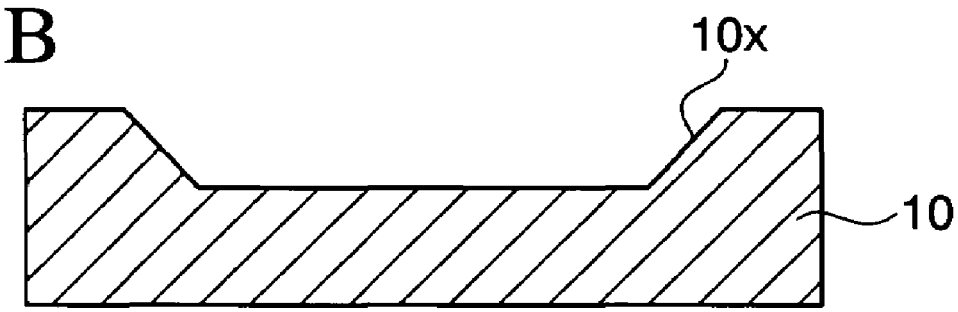
Figure 1C:
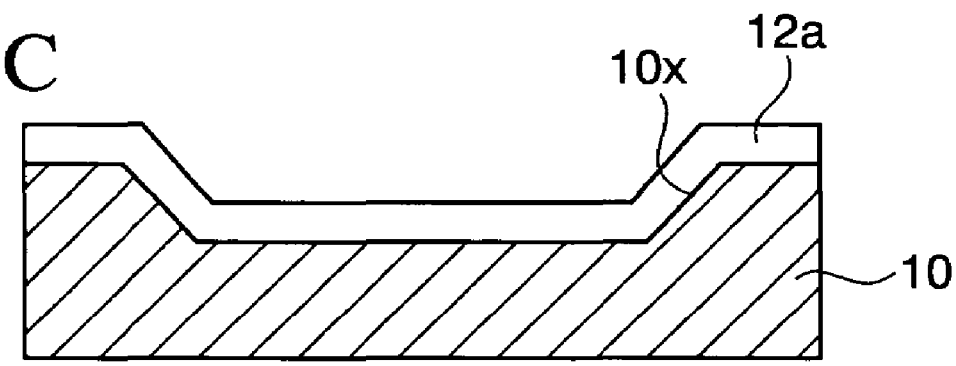

In the method of manufacturing the electronic parts packaging structure in the present embodiment, as shown in FIG. 1A, a metal plate 10 made of copper (Cu), aluminum (Al), or the like is prepared. Then, as shown in FIG. 1B, a cavity 10x is obtained by forming a concave portion on the upper surface side of the metal plate 10 by the press working. Then, as shown in FIG. 1C, a resin film 12a made of a polyimide resin in an semi-cured state (B-stage), or the like is pasted onto the upper surface side of the metal plate 10.

Figure 1D:
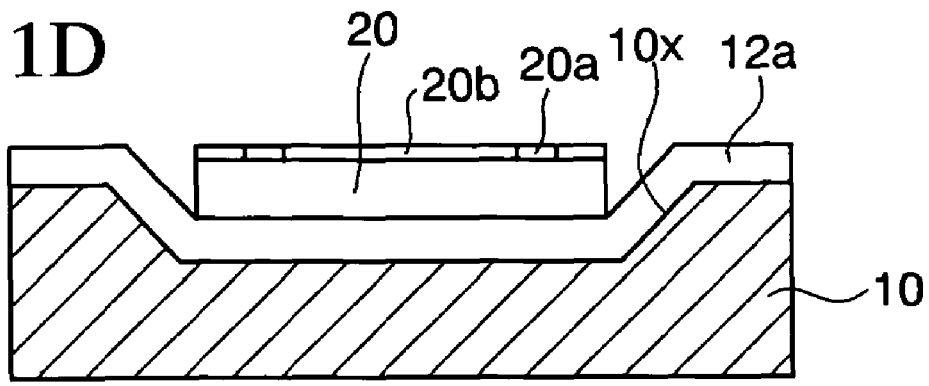

Then, as shown in FIG. 1D, a semiconductor chip 20 (electronic parts) connection pads 20a and a passivation film 20b of which are exposed from its upper surface side is prepared. The semiconductor chip 20 is arranged on the resin film 12a in the cavity 10x of the metal plate 10 to direct the connection pads 20a upward. The thin-type chip is used as the semiconductor chip 20 and, for example, a thickness is 50 μm or less (preferably about 20 μm). In this case, various electronic parts such as the capacitor, or the like can be employed instead of the semiconductor chip 20.

Figure 1E:
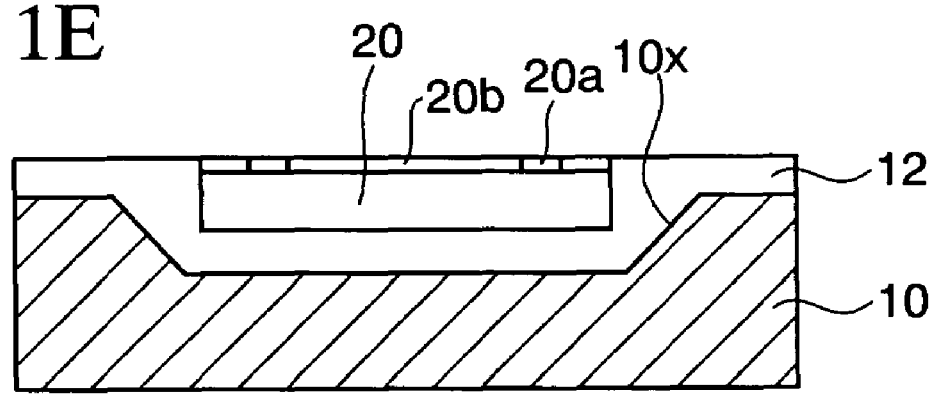

Then, as shown in FIG. 1E, the pressure (heat press) is applied to the semi-cured resin film 12a in a vacuum atmosphere (low pressure atmosphere) while heating at a temperature of 150 to 200° C. Thus, a first insulating layer 12 is obtained by curing the semi-cured resin film 12a in its fluidized state. At this time the resin film 12a is cured on the semiconductor chip 20 side in its fluidized state, so that a clearance on the side surface side of the semiconductor chip 20 is filled with the first insulating layer 12. Accordingly, a level difference on the semiconductor chip 20 is eliminated and thus an upper surface of the semiconductor chip 20 and an upper surface of the first insulating layer 12 are planarized as a coplanar surface.

In this manner, a depth of the cavity 10x formed on the metal plate 10 is adjusted appropriately such that a level difference on the semiconductor chip 20 is eliminated. Preferably a depth of the cavity 10x is set equally to a thickness of the semiconductor chip 20. At this time, because of the fluidization/curing of the resin film 12a, the semiconductor chip 20 is also adhered to the resin layer 12 unless an adhesive layer is particularly used. Here, the cavity 10x is not always formed on the metal plate 10.

Figure 1F:
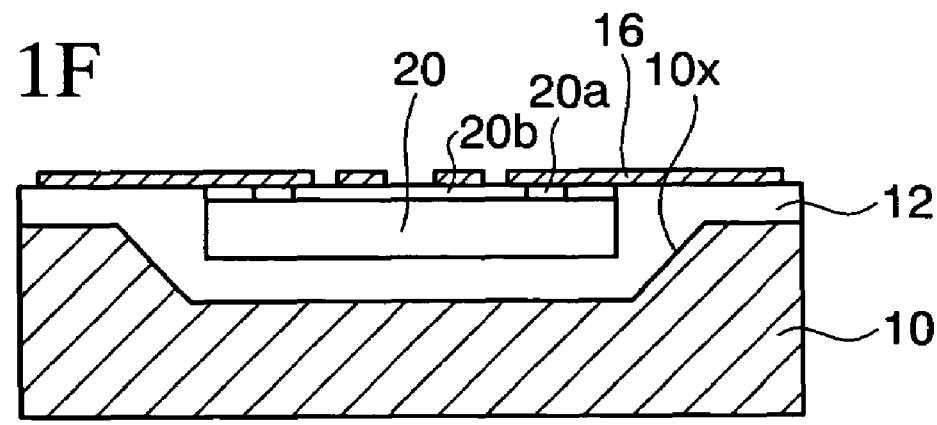

Then, as shown in FIG. 1F, a wiring layer 16 connected electrically to the connection pads 20a of the semiconductor chip is formed on the semiconductor chip 20 and the first insulating layer 12. The wiring layer 16 is formed by the semi-additive process, for example. In more detail, first a seed layer (not shown) made of Cu, or the like is formed on the semiconductor chip 20 and the first insulating layer 12 by the electroless plating or the sputter method. Then, a resist film (not shown) in which an opening is formed in a portion in which the wiring layer 16 is formed is patterned. Then, a metal layer pattern (not shown) is formed on the seed layer in the opening of the resist film by the electroplating using the seed layer as a plating power feeding layer. Then, the resist film is removed and then the seed layer is etched by using the metal layer pattern as a mask. Thus, the wiring layer 16 is obtained.

In this case, an insulating layer in which via holes are formed on the connection pads 20a of the semiconductor chip 20 may be formed on the semiconductor chip 20, and then the wiring layer 16 connected to the connection pads 20a via the via holes may be formed on the insulating layer.

Figure 1G:
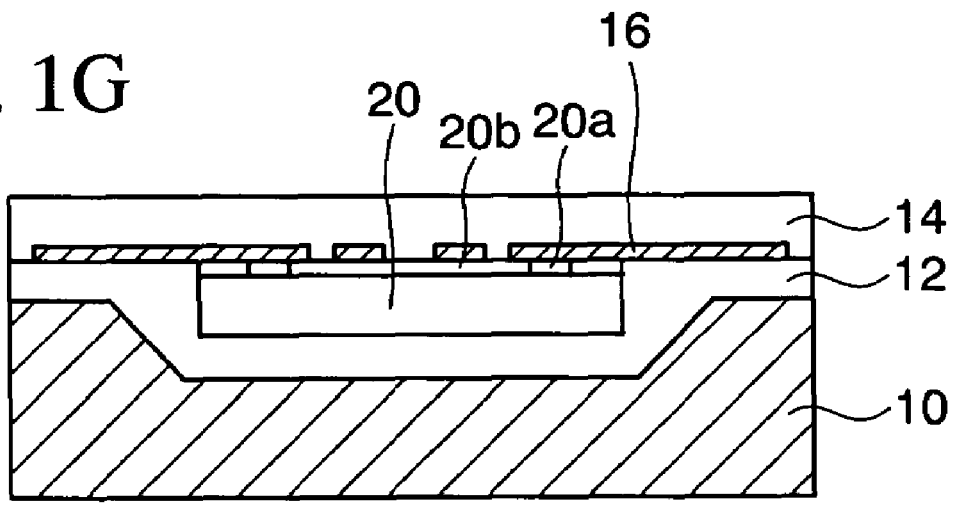
Figure 1H:
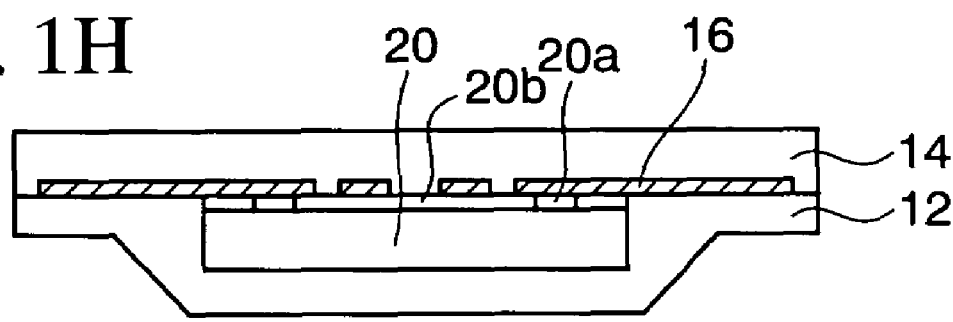

Then, as shown in FIG. 1G, a second insulating layer 14 for covering the semiconductor chip 20 and the wiring layer 16 is formed by pasting a resin film made of a polyimide resin, or the like, for example. Then, as shown in FIG. 1H, the metal plate 10 is removed selectively from the first insulating layer 12. When the metal plate 10 is made of copper, the wet etching using iron (III) chloride aqueous solution, copper (II) chloride aqueous solution, ammonium peroxodisulfate aqueous solution, or the like is employed in etching the metal plate 10.

Figure 1I:
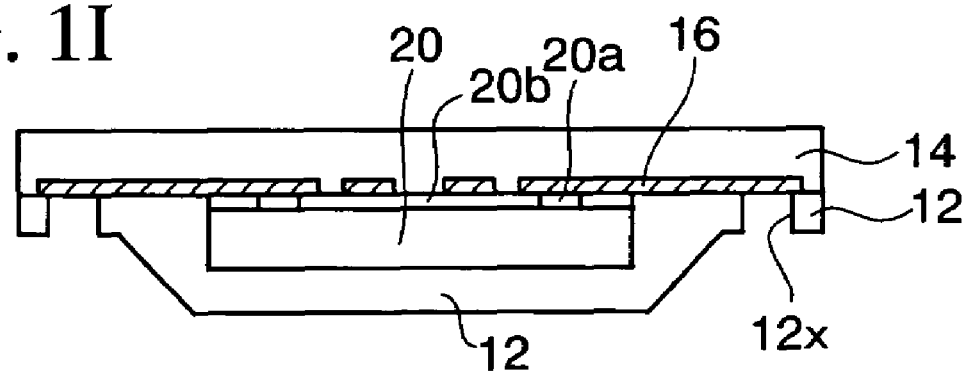

Then, as shown in FIG. 1I, via holes 12x each having a depth that reaches an under surface of the wiring layer 16 are formed by processing the first insulating layer 12 by means of the laser, or the like. Then, connection portions are obtained by forming a nickel (Ni)/gold (Au) plating layer (not shown) on portions of the wiring layer 16 exposed in the via holes 12x. Then, as shown in FIG. 1J, external connection terminals 18 connected to the wiring layer 16 to project downward from the first insulating layer 12 are formed by mounting the solder ball on the connection portions of the wiring layer 16, or the like.

As a result, an electronic parts packaging structure 1 of the present embodiment can be obtained. In the present embodiment, a mode in which one-layer wiring layer 16 connected electrically to the connection pads 20a of the semiconductor chip 20 is formed is illustrated. But a mode in which an n-layered (n is an integer in excess of 2) built-up wiring layer is formed may be employed. In this case, all the insulating layers are formed of the same material.

Figure 1J:
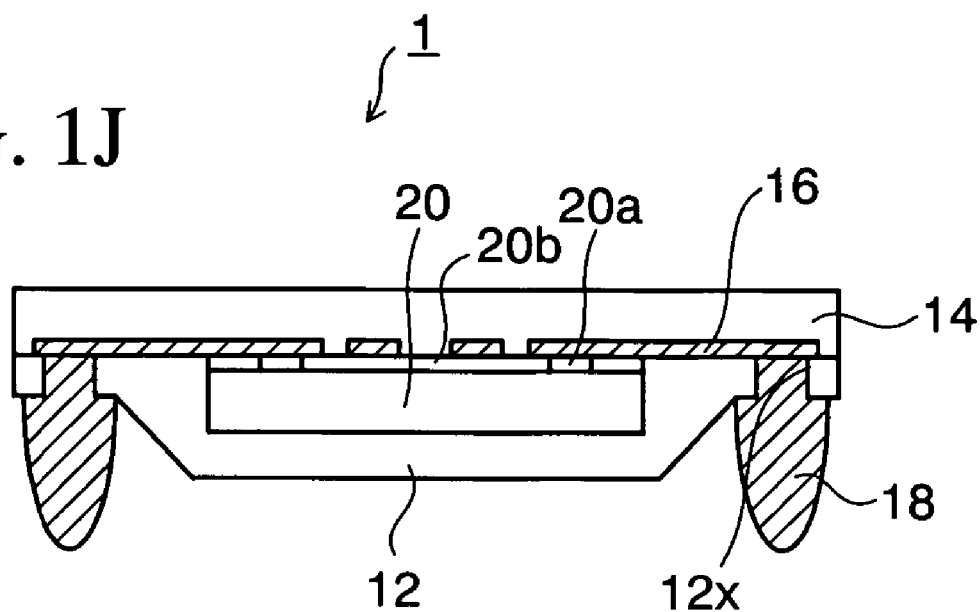

Then, as shown in FIG. 1J, in the electronic parts packaging structure 1 of the present embodiment, the semiconductor chip 20 is buried in the first insulating layer 12 such that the upper surface of the semiconductor chip 20 and the upper surface of the first insulating layer 12 constitute the substantially same coplanar surface, whereby a level difference on the semiconductor chip 20 is planarized. The wiring layer 16 connected to the connection pads 20a of the semiconductor chip 20 is formed on the semiconductor chip 20 and the first insulating layer 12. Also, the semiconductor chip 20 and the wiring layer 16 are covered with the second insulating layer 14. Also, the via holes 12x are formed on the portions of the first insulating layer 12 under the wiring layer 16, and the external connection terminals 18 connected to the wiring layer 16 via the via holes 12x are provided.

In this manner, in the electronic parts packaging structure 1 of the present embodiment, the first insulating layer 12 and the second insulating layer 14 made of a polyimide resin, for example, function as a flexible insulating substrate, and the semiconductor chip 20 is mounted to be buried in the insulating substrate. That is, semiconductor chip 20 is mounted such that the whole of the chip is covered with the first and second insulating layers 12, 14 made of a polyimide resin.

Like the prior art, in the case where the semiconductor (silicon) chip (thermal expansion coefficient: almost 3 ppm/° C.) is mounted on the core substrate (rigid substrate) in a state that such chip is covered with the epoxy resin (thermal expansion coefficient: almost 20 ppm/° C.), or the like, a warp of the electronic parts packaging structure is prone to occur by the thermal stress caused due to a difference between the thermal expansion coefficients. However, in the present embodiment, the thermal expansion coefficient of the first and second insulating layers 12, 14 (flexible insulating substrate) made of the polyimide resin is almost 11 ppm/° C. and is able to close resemble the thermal expansion coefficient (almost 3 ppm/° C.) of the semiconductor chip (silicon chip) 20 buried in the flexible insulating substrate. Therefore, generation of the thermal stress can be suppressed and thus generation of the warp can be prevented. In addition, the insulating layers 12, 14 made of the same material are formed on the whole outer surface side (both surface sides, all side surface sides) of the semiconductor chip 20. Therefore, even though the thermal stress is generated, it has the structure that such stress can be cancelled mutually.

Further, in the present embodiment, in curing the semi-cured first insulating layer 12, the semiconductor chip 20 is adhered onto the first insulating layer 12. Thus, there is no need to use particularly an adhesive layer. Therefore, the generation of the warp of the packaging structure can be prevented from such a standpoint that the adhesive layer having a thermal expansion coefficient different from the semiconductor chip 20 is not left in the packaging structure.

In this way, in the present embodiment, the semiconductor chip 20 is mounted in a state that such chip is surrounded by the polyimide resin whose thermal expansion coefficient is close to that of the chip, the warp caused due to the thermal stress can be prevented. In addition, in mounting the semiconductor chip 20, such semiconductor chip 20 is buried in the polyimide resin that has rigidity while still maintaining flexibility. Therefore, the packaging structure can also be mounted even in a situation that the substrate is curved intentionally.

From such a viewpoint that generation of the warp of the electronic parts packaging structure should be suppressed to the lowest minimum, it is preferable that the polyimide resin should be employed as the first and second insulating layers 12, 14 that function as the flexible insulating substrate. But the insulating material such as an epoxy resin, a polyurethane resin, an acrylic resin, a silicon resin, or the like may be employed. Then, the semiconductor chip 20 is covered with the insulating layer selected from these resins and then mounted.

Figure 2A:
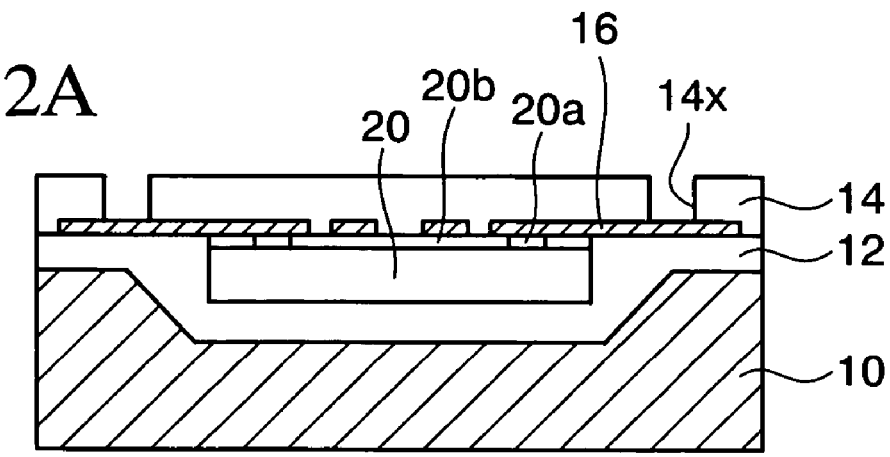
FIGS. 2A to 2C are sectional views showing a variation of the method of manufacturing an electronic parts packaging structure according to the first embodiment of the present invention.
Figure 2B:
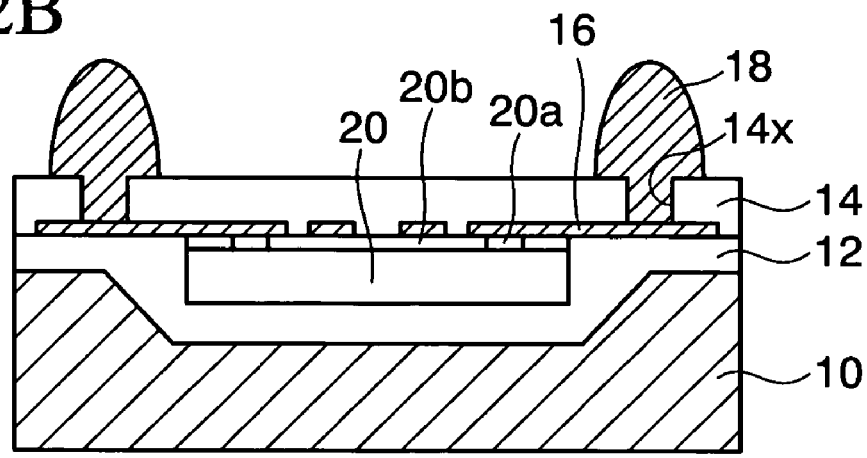
Figure 2C:
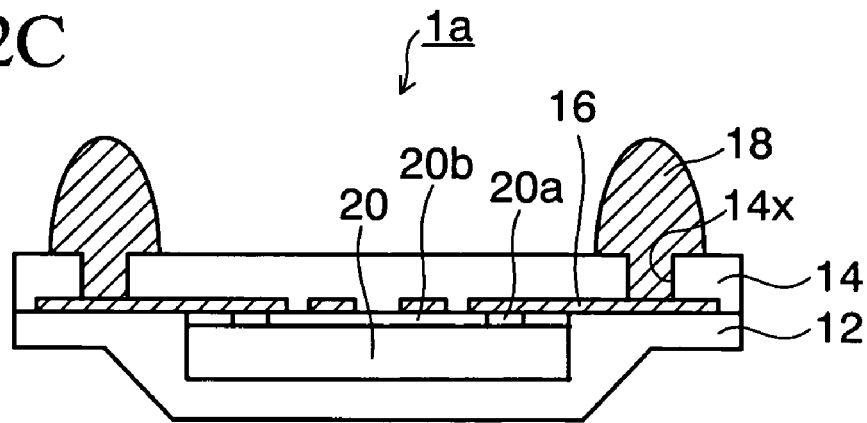

A variation of the method of manufacturing an electronic parts packaging structure according to the first embodiment of the present invention is shown in FIGS. 2A to 2C. As shown in FIG. 2A, first the foregoing structure shown in FIG. 1G is prepared. Then, via holes 14x each having a depth that reaches an upper surface of the wiring layer 16 are formed by processing the second insulating layer 14 by means of the laser, or the like. Then, the connection portions are obtained by forming a nickel (Ni)/gold (Au) plating layer (not shown) on portions of the wiring layer 16 exposed in the via holes 14x. Then, as shown in FIG. 2B, the external connection terminals 18 connected to the wiring layer 16 are formed by mounting the solder balls on the connection portions of the wiring layer 16, or the like to project from the second insulating layer 14. Then, as shown in FIG. 2C, the metal plate 10 is removed selectively from the first insulating layer 12.

In this case, the metal plate 10 may be removed after the via holes 14x and the external connection terminals 18 are formed.

As a result, an electronic parts packaging structure 1a of the variation of the present embodiment can be obtained. According to the electronic parts packaging structure 1a of the variation, the same advantages as those of the above electronic parts packaging structure 1 can be achieved.

Second Embodiment

Figure 3A:
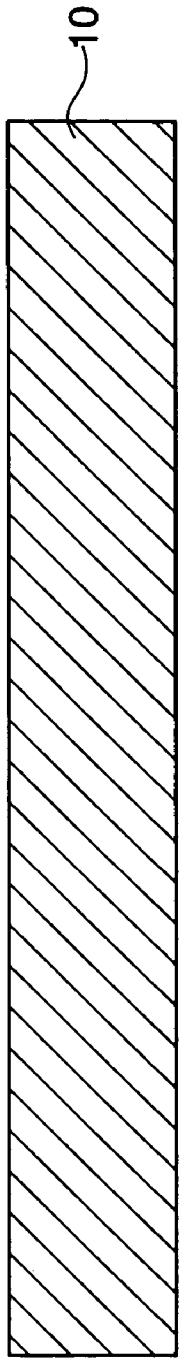
FIGS. 3A to 3N are sectional views showing a method of manufacturing an electronic parts packaging structure according to a second embodiment of the present invention.
Figure 3B:
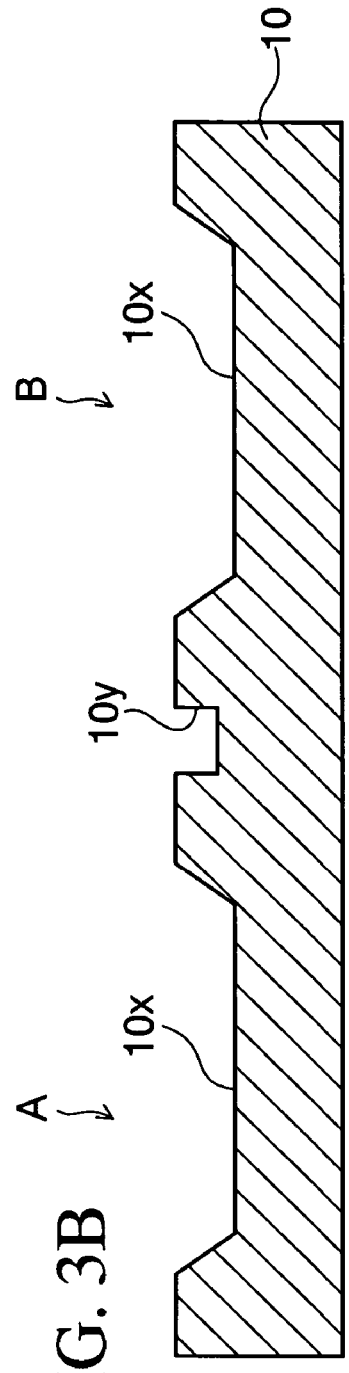
Figure 3C:
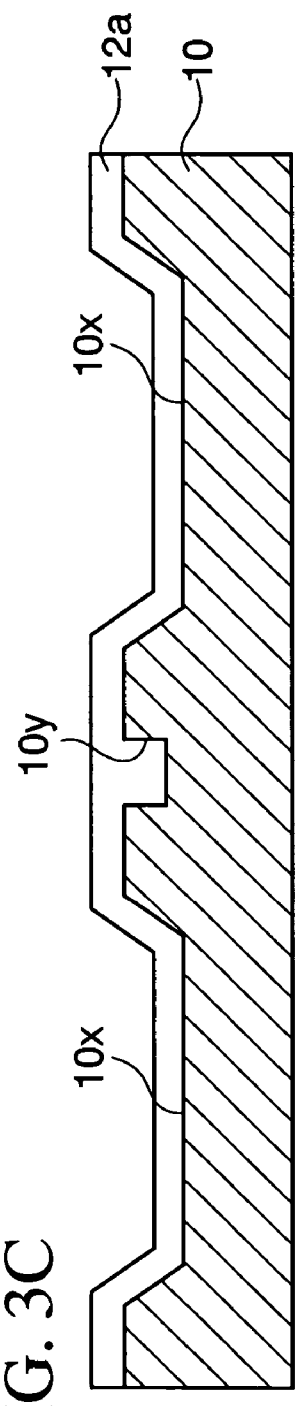
Figure 3I:
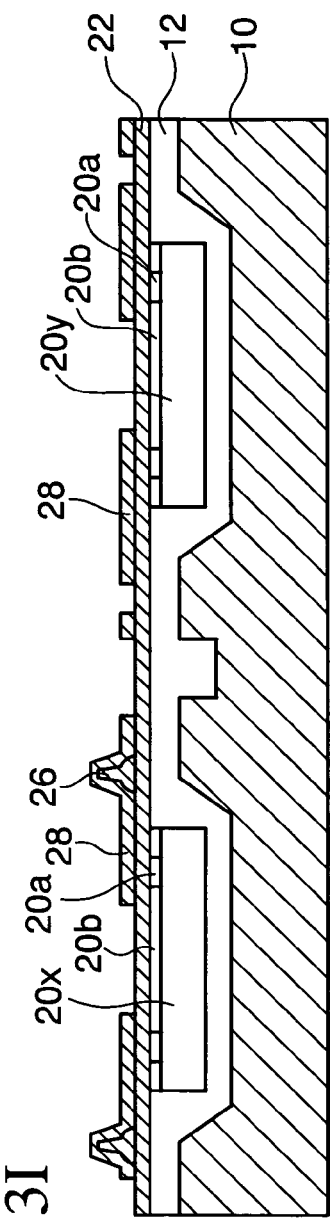
Figure 3J:
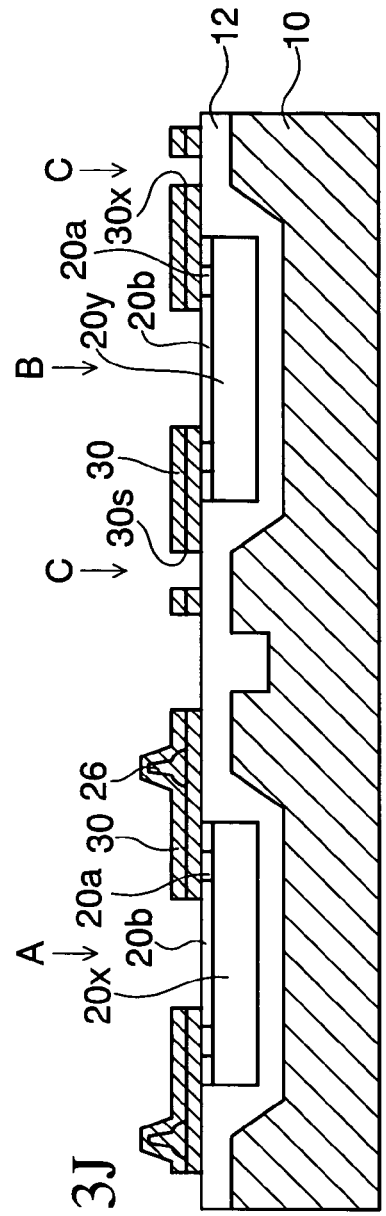
Figure 3K:
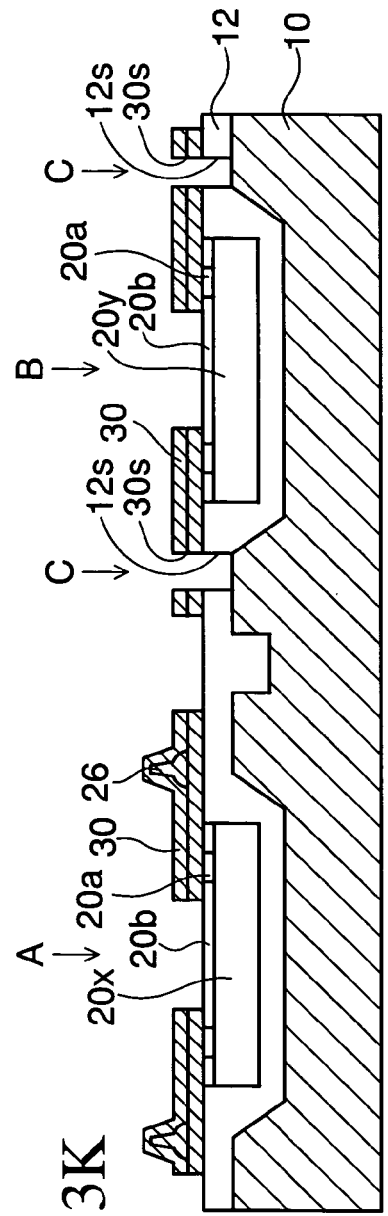
Figure 3L:
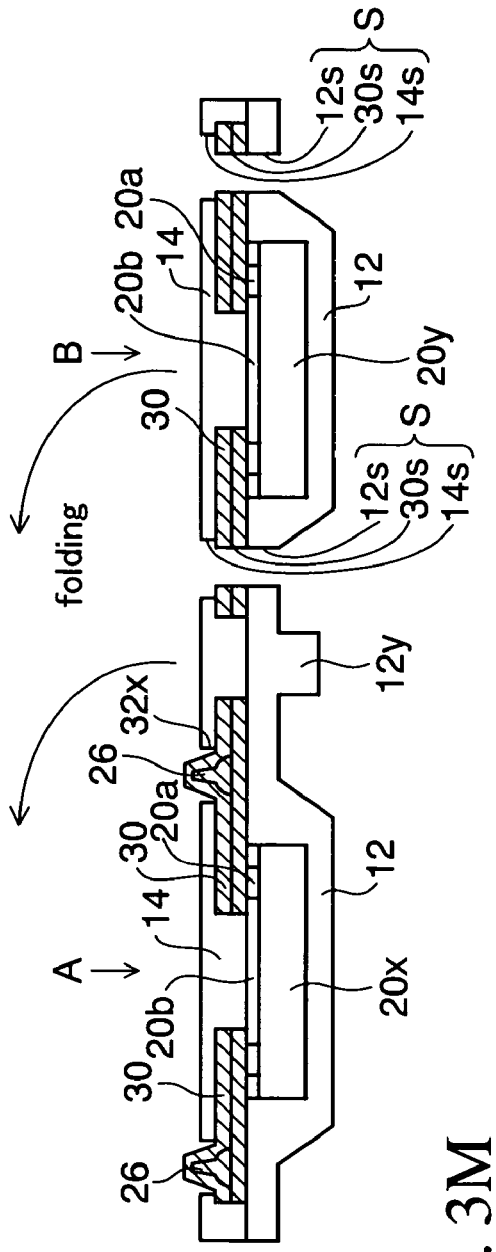
Figure 3M:
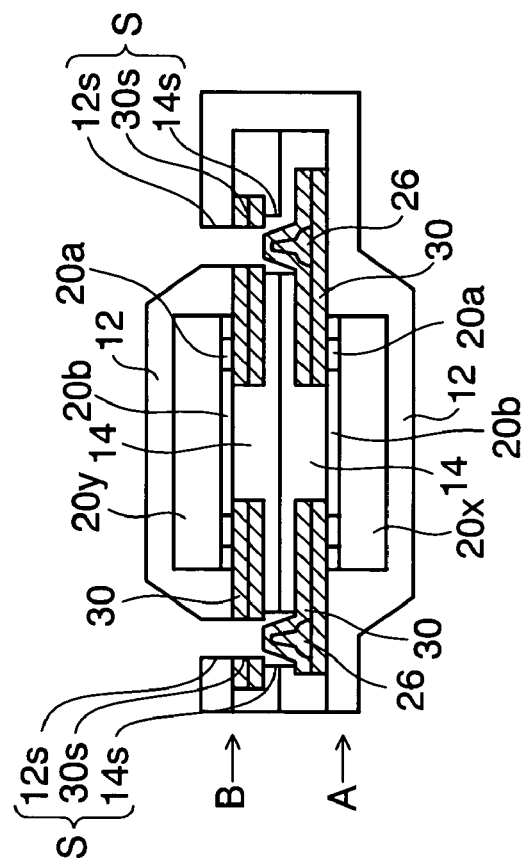
Figure 3N:
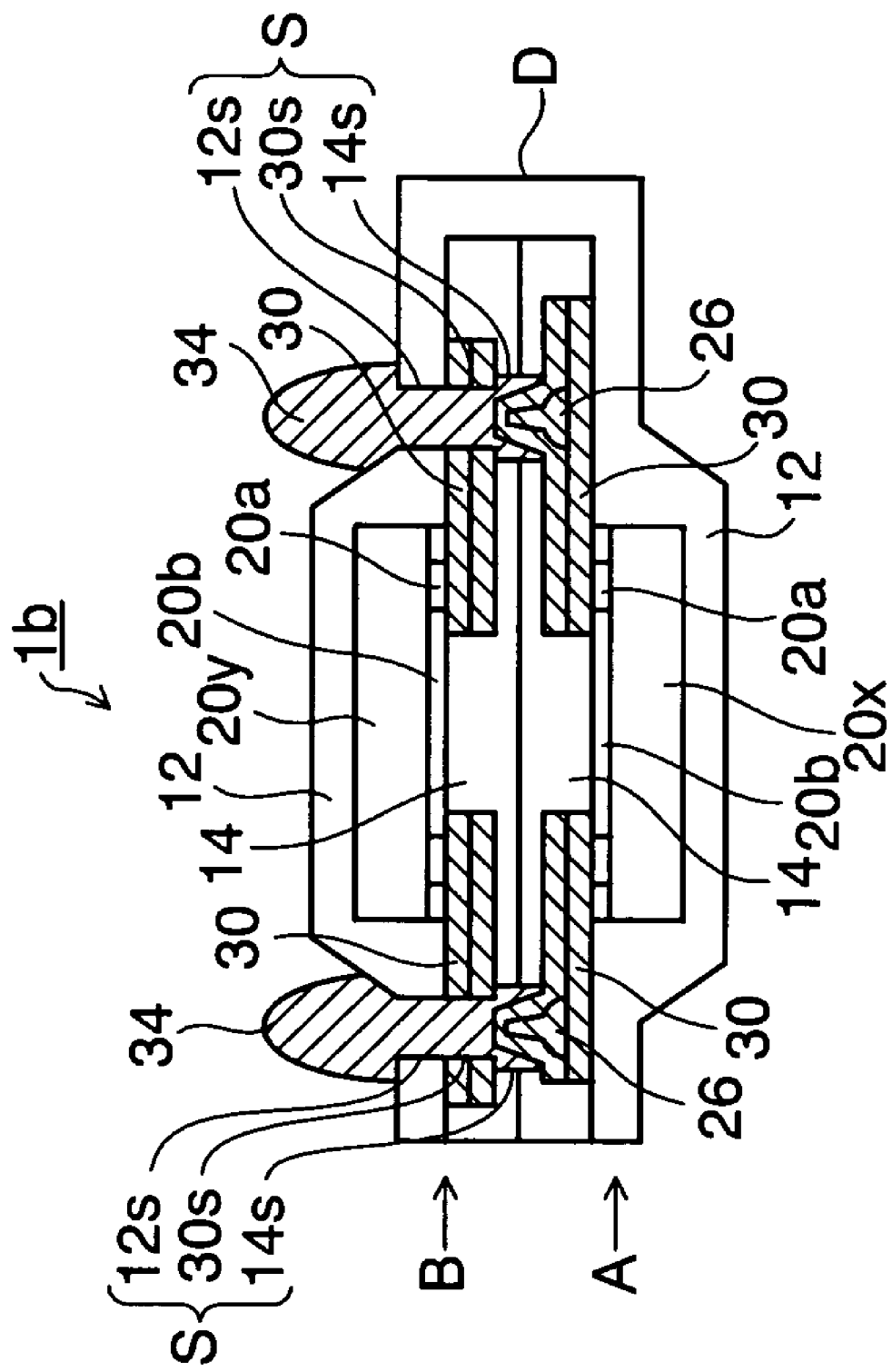

FIGS. 3A to 3N are sectional views showing a method of manufacturing an electronic parts packaging structure according to a second embodiment of the present invention. The second embodiment gives a mode in which the present invention is applied to the folding type electronic parts packaging structure. In the second embodiment, detailed explanation of the same steps as those in the first embodiment will be omitted.

In the method of manufacturing the electronic parts packaging structure according to the second embodiment of the present invention, like the first embodiment, as shown in FIGS. 3A and 3B, first the metal plate 10 is prepared. The cavities 10x are obtained by forming the concave portions on the upper surface side of the metal plate 10 by the press working. In the second embodiment, a plurality of cavities are formed in a plurality of mounting areas respectively. In an example shown in FIG. 3B, the cavity 10x is formed in first and second mounting areas A, B respectively, and simultaneously a recess portion 10y for defining a folding portion upon bending the packaging structure is formed in a portion of the metal plate 10 between two cavities 10x.

Then, as shown in FIG. 3C, like the first embodiment, the resin film 12a made of a polyimide resin in the semi-cured state (B-stage), or the like is pasted onto the upper surface side of the metal plate 10. Then, as shown in FIG. 3D, first and second semiconductor chips 20x, 20y (electronic parts) having such a structure that the connection pads 20a and the passivation film 20b are exposed like the first embodiment are prepared. The first and second semiconductor chips 20x, 20y are placed on the resin film 12a in the first and second mounting areas A, B respectively to direct the connection pads 20a upward.

Then, as shown in FIG. 3E, like the first embodiment, the heat and pressure (heat press) is applied to the resin film 12a. Thus, the first resin layer 12 is obtained by curing the semi-cured resin film 12a in its fluidized state. Accordingly, the clearance formed on the sides of the first and second semiconductor chips 20x, 20y is filled with the first resin layer 12, so that the upper surfaces of the first and second semiconductor chips 20x, 20y and the upper surface of the first resin layer 12 are planarized as an almost same surface.

Then, as shown in FIG. 3F, a conductive layer 22 is obtained on the first and second semiconductor chips 20x, 20y and the first resin layer 12 by forming a chromium (Cr) layer and a copper (Cu) layer sequentially by means of the sputter method, or the like. Then, as shown in FIG. 3G, a resist film 24 in which opening portions 24x are provided in portions in which the wiring layers are patterned, and then stud bumps 26 are formed on the connection pad portions of the conductive layer 22 by the wire bonding method. The bumps 26 are formed of copper (Cu) or gold (Au). That is, a top end portion of the Cu (or Au) wire is melted like a ball in the wire bonding, then the ball-like portion is jointed to the connection pad portion, and then the wire is pulled up and cut, whereby the stud bumps 26 whose wire is projected from the ball-like portion are formed.

Then, as shown in FIG. 3H, a metal layer pattern 28 made of Cu or Au is formed on the conductive layer 22 in the opening portions 24x in the resist film 24 by the electroplating using the conductive layer 22 as the plating power feeding layer. At this time, the metal layer pattern 28 is formed simultaneously on the surfaces of the bumps 26.

Then, a plating layer (not shown) to prevent the diffusion of the solder is applied to the surfaces of the bumps 26 and the surfaces of the metal layer patterns 28. As the plating layer, for example, a nickel plating layer, a palladium plating layer, and a gold plating layer are formed sequentially.

Then, as shown in FIG. 3I, a part of the conductive layer 22 is exposed by removing the resist film 24. Then, as shown in FIG. 3J, wiring layers 30 connected to the bumps 26 are obtained by etching the conductive layer 22 by using the metal layer patterns 28 as a mask. In this manner, the wiring layers 30 are formed and connected to the connection pads 20a of the first and second semiconductor chips 20x, 20y. The wiring layers 30 are formed in a state that opening portions 30s are provided in portions indicated as a C portion in the second mounting area B.

Then, as shown in FIG. 3K, opening portions 12s are formed by processing the first insulating layer 12 in the opening portions 30s of the wiring layers 30 in the portions indicated as the C portion in the second mounting area B by the laser, or the like. As described later, in folding the packaging structure, the bumps 26 in the first mounting area A are positioned correspondingly in the opening portions 30s of the wiring layers 30 and the opening portions 12s in the first insulating layer 12.

Then, as shown in FIG. 3L, the second insulating layer 14 made of a polyimide resin, or the like, in which opening portions 14s for exposing the bumps 26 and the opening portions 30s of the wiring layers 30 are provided, is formed on the first and second semiconductor chips 20x, 20y and the wiring layers 30. Accordingly, through holes S composed of the opening portion 14s of the second insulating layer 14, the opening portion 30s of the wiring layers 30, and the opening portion 12s of the first insulating layer 12 are formed.

In this case, as the method of forming the through holes S, the opening portions 30s, 12s are not formed previously in the wiring layer 30 and the first insulating layer 12 in the above steps in FIGS. 3J and 3K, but the through holes S may be formed by etching the wiring layer 30 and the first insulating layer 12 via the opening portions 14s in the second insulating layer 14 in the step in FIG. 3L.

Then, the metal plate 10 is removed selectively from the first insulating layer 12, and thus a projection portion 12y of the first insulating layer 12 formed by the recess portion 10y of the metal plate 10 is exposed. Accordingly, the packaging structure in which the whole of the first and second semiconductor chips 20x, 20y is covered with the first and second insulating layers 12, 14 made of a polyimide resin respectively is obtained.

Then, as shown in FIG. 3M, in the packaging structure in FIG. 3L, the second mounting area B is folded toward the first mounting area A side centering on the projection portion 12y of the first insulating layer 12. Thus, the top end sides of the bumps 26 in the first mounting area A are inserted and fitted into the through holes S in the second mounting area B. At this time, a heat treatment is applied while using the semi-cured resin layer as the second insulating layer 14, and thus the second insulating layers 14 opposing to each other in the first mounting area A and the second mounting area B are bonded.

In the present embodiment, since the first and second semiconductor chips 20x, 20y are buried in the first and second insulating layers 12, 114 acting as the flexible insulating substrate, this packaging structure can be easily folded.

Then, as shown in FIG. 3N, external connection terminals 34 are formed by pouring the solder into the through holes S in the second mounting area B, which is arranged on the first mounting area A to overlap with each other, or the like. The first semiconductor chip 20x and the second semiconductor chip 20y are connected electrically mutually by such plug-in mounting. The external connection terminals 34 are connected to the bumps 26 connected to the first semiconductor chip 20x and the wiring layers 30 connected to the second semiconductor chip 20y respectively, and function as common terminals of the first and second semiconductor chips 20x, 20y.

With the above, an electronic parts packaging structure 1b according to the second embodiment of the present invention can be obtained.

As shown in FIG. 3N, in the electronic parts packaging structure 1b of the present embodiment, the first and second semiconductor chips 20x, 20y are buried in a state that the whole of first and second semiconductor chips 20x, 20y is covered with the first and second insulating layers 12, 14 acting as the flexible insulating substrate. The first and second insulating layers 12, 14 are folded via a folding portion D and the second semiconductor chip 20y is positioned over the first semiconductor chip 20x to overlap with each other. Then, the wiring layers 30 connected to the connection pad 20a are formed on the first semiconductor chip 20x in a state that the wiring layers 30 are buried in the second insulating layer 14. Also, the bumps 26 are formed on the wiring layer 16 connected to the first semiconductor chip 20x.

Also, the wiring layers 30 connected to the connection pads 20a are formed on the second semiconductor chip 20y (under the second semiconductor chip 20y in FIG. 3N) in a state that the wiring layers 30 are buried in the second insulating layer 14. Also, the through holes S are provided in the portions of the first and second insulating layers 12, 14 and the wiring layers 30 near the side of the second semiconductor chip 20y, and the top end sides of the bumps 26 connected to the first semiconductor chip 20x are inserted into the through holes S. Also, the external connection terminals 34 made of the solder, or the like are formed in the through holes S. The external connection terminals 34 are connected electrically to the bumps 26 connected to the first semiconductor chip 20x and the wiring layers 30 connected to the second semiconductor chip 20y respectively, and function as the common terminals of the first and second semiconductor chips 20x, 20y. In this case, the external connection terminals 34 may be formed as the independent terminals that are connected either of the first semiconductor chip 20x and the second semiconductor chip 20y only.

The electronic parts packaging structure 1b of the present embodiment can achieve the similar advantages to the first embodiment. Also, the electronic parts packaging structure 1b of the present embodiment is packaged by folding the structure in which the first and second semiconductor chips 20x, 20y are buried in the first and second insulating layers 12, 14 acting as the flexible insulating substrate and are mounted respectively. Therefore, an area of the electronic parts packaging structure can be reduced remarkably rather than the case where two semiconductor chips are mounted in parallel in the horizontal direction, and thus the small-sized flexible electronic parts packaging structure can be readily obtained.

In the present embodiment, such a mode is exemplified that structure body in which two semiconductor chips 20x, 20y are mounted on two mounting areas A, B respectively is folded. But a plurality of semiconductor chips may be mounted similarly and any mounting areas may be folded.

Third Embodiment

Figure 4:
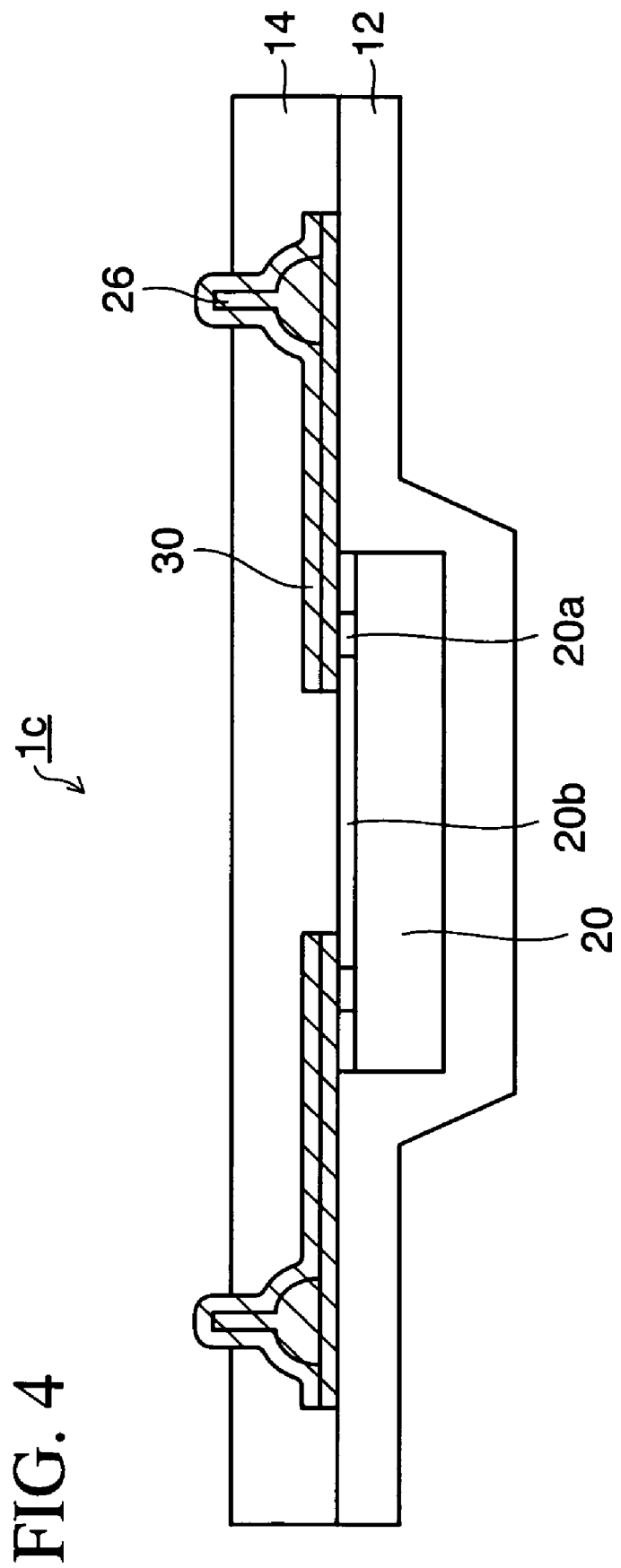
FIG. 4 is a sectional view (sectional view taken along I-I in FIG. 5) showing an electronic parts packaging structure according to a third embodiment of the present invention.
Figure 5:
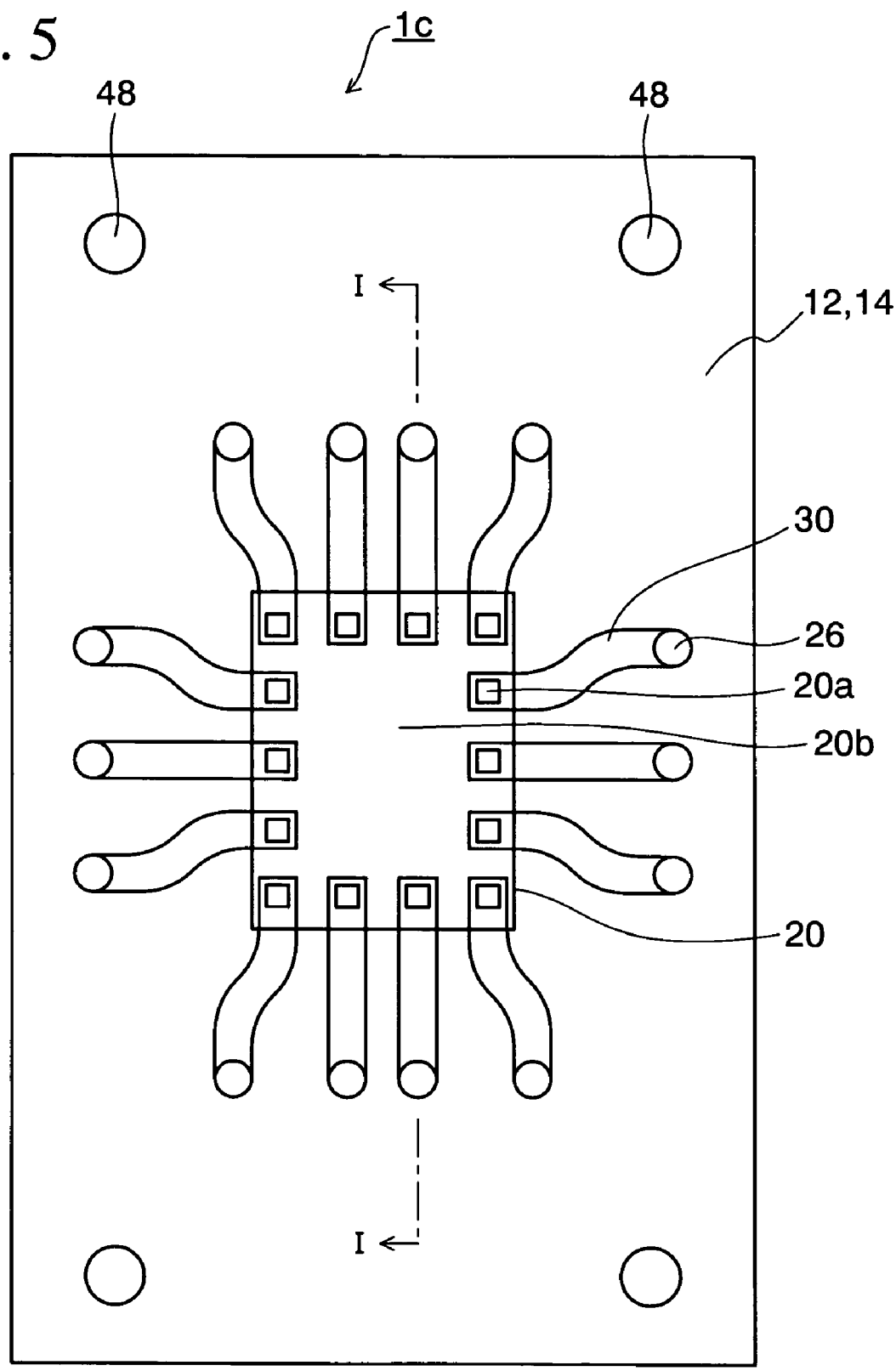
FIG. 5 is a plan view showing the electronic parts packaging structure according to the third embodiment of the present invention.

FIG. 4 is a sectional view (sectional view taken along I-I in FIG. 5) showing an electronic parts packaging structure according to a third embodiment of the present invention, and FIG. 5 is a plan view showing the same electronic parts packaging structure.

In the third embodiment, a mounting example of the electronic parts packaging structure of the present invention will be explained hereunder. In this case, the same reference symbols are affixed to the same elements in the first and second embodiments, and their detailed explanation will be omitted herein.

As shown in FIG. 4 and FIG. 5, like the first embodiment, in an electronic parts packaging structure 1c of the third embodiment, the semiconductor chip 20 having the connection pads 20a and the passivation film 20b on its upper surface is buried in the first insulating layer 12 made of a polyimide resin, or the like such that their upper surfaces constitute the almost coplanar surface. The wiring layer 30 connected to the connection pads 20a of the semiconductor chip 20 is formed on the semiconductor chip 20 and the first insulating layer 12, and the stud bumps 26 are formed on the connection portions of the wiring layer 30. The wiring layer 30 and the bumps 26 are formed by the same method as the second embodiment. Also, the second insulting layer 14 made of a polyimide resin, or the like, which is provided to protrude and expose the top end sides of the bumps 26, is formed on the upper surface side of the semiconductor chip 20.

In this manner, like the first and second embodiments, the first and second insulating layers 12, 14 function as the flexible insulating substrate, the whole of semiconductor chip 20 is buried in the insulating layers, and the bumps 26 connected electrically to the connection pads 20a of the semiconductor chip 20 via the wiring layer 30 are provided to protrude from the second insulting layer 14. The bumps 26 are made of Cu or Au. Also, the electronic parts packaging structure 1c of the present embodiment provides the technical idea applied to the case where it is mounted directly on the enclosure (the case, the frame, or the like) of various electronic devices other than the case where it is mounted on the mounting substrate being prepared particularly. Therefore, fixing holes 48 (FIG. 5) used to fit the packaging structure to the enclosure of the electronic device are provided to corner portions of the electronic parts packaging structure.

Figure 6:
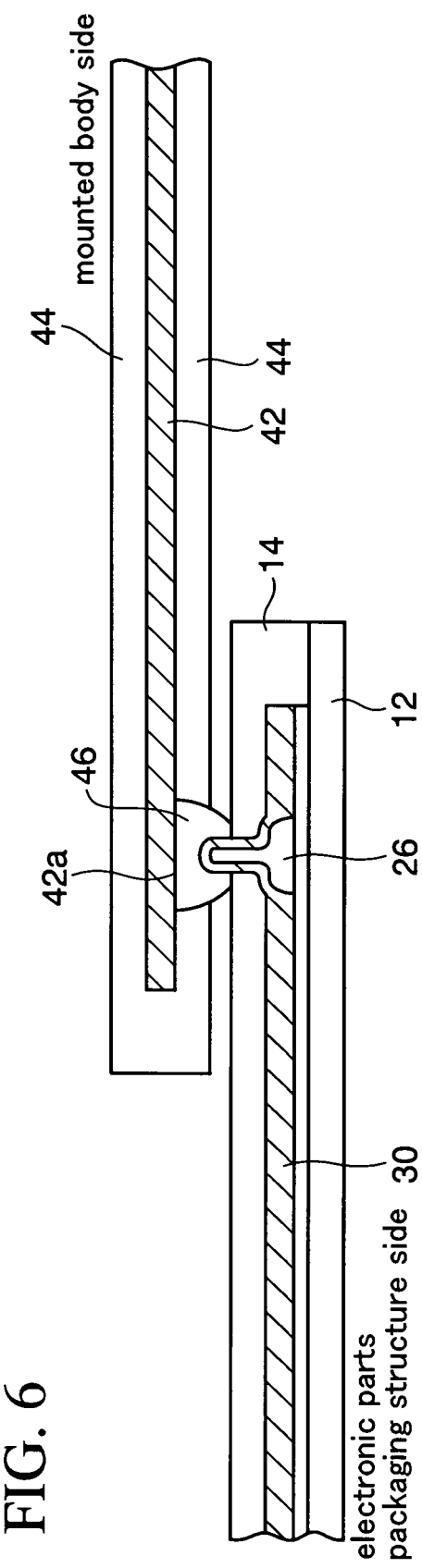
FIG. 6 is a sectional view showing a first method by which the electronic parts packaging structure according to the third embodiment of the present invention is mounted on a mounted body.
Figure 7:
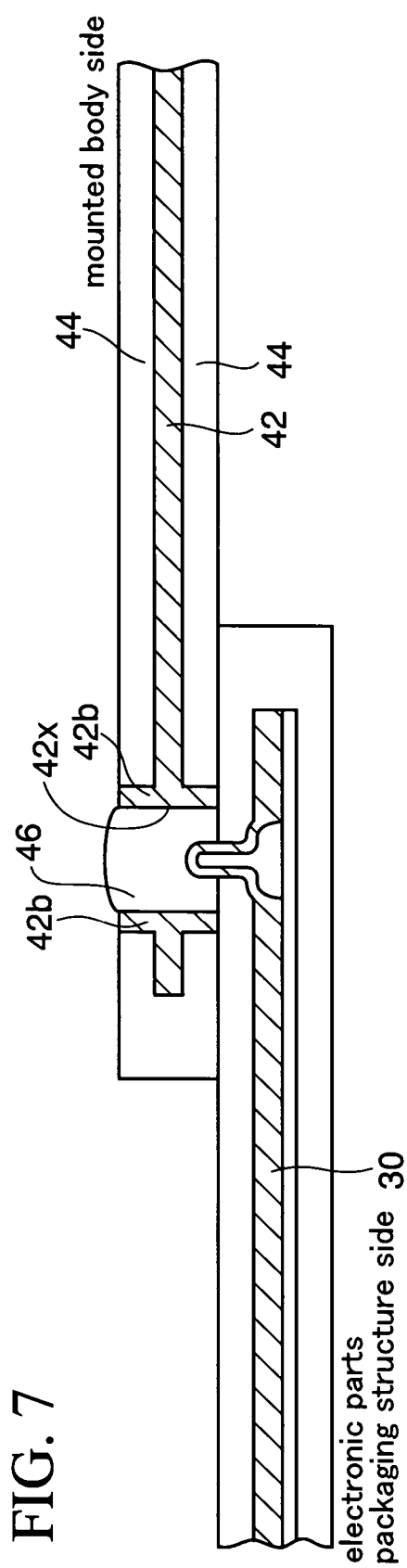
FIG. 7 is a sectional view showing a second method by which the electronic parts packaging structure according to the third embodiment of the present invention is mounted on a mounted body.

A situation in which bumps of the electronic parts packaging structure according to the third embodiment are connected to wirings of the mounted body is shown in FIG. 6 and FIG. 7. As shown in FIG. 6, on the mounted body side, a wiring layer 42 is covered with an insulating layer 44, and solder layers 46 are formed on connection portions 42a of the wiring layer 42. Then, the stud bumps 26 connected to the wiring layer 30 of the electronic parts packaging structure 1c of the present embodiment are connected electrically to the wiring layer 42 of the mounted body via the solder layers 46.

Alternately, as shown in FIG. 7, on the mounted body side, an opening portion 42x may be provided in the connecting portion of the wiring layer 42 covered with the insulating layer 44, and a sidewall wiring portion 42b connected to the wiring layer 42 may be provided on the side surface of the opening portion 42x. In this case, the top end portions of the bumps 26 connected to the wiring layer 30 of the electronic parts packaging structure 1c of the present embodiment are inserted into the opening portions 42x of the wiring layer 42 on the mounted body side, and then connected electrically to the wiring layer 42 of the mounted body side via the solder layers 46 formed in the opening portions 42x. In the example in FIG. 7, since the electronic parts packaging structure 1c can be brought into contact with the wiring layer 42 covered with the insulating layer 44 on the mounted body side to create no clearance, a resultant thickness can be reduced thinner than that in the example in FIG. 6. Here, the connection portions on the electronic parts packaging structure 1c side and the connection portions on the mounted body side may be reversed in the mounting. The connecting method explained in FIG. 6 and FIG. 7 is called the "plug-in mounting".

The electronic parts packaging structure 1c of the present embodiment can be mounted on various mounted bodies because the semiconductor chip 20 is buried in the flexible insulating substrate (the first and second insulating layers 12, 14) made of a polyimide resin, or the like and also its thickness can be reduced.

Figure 8:
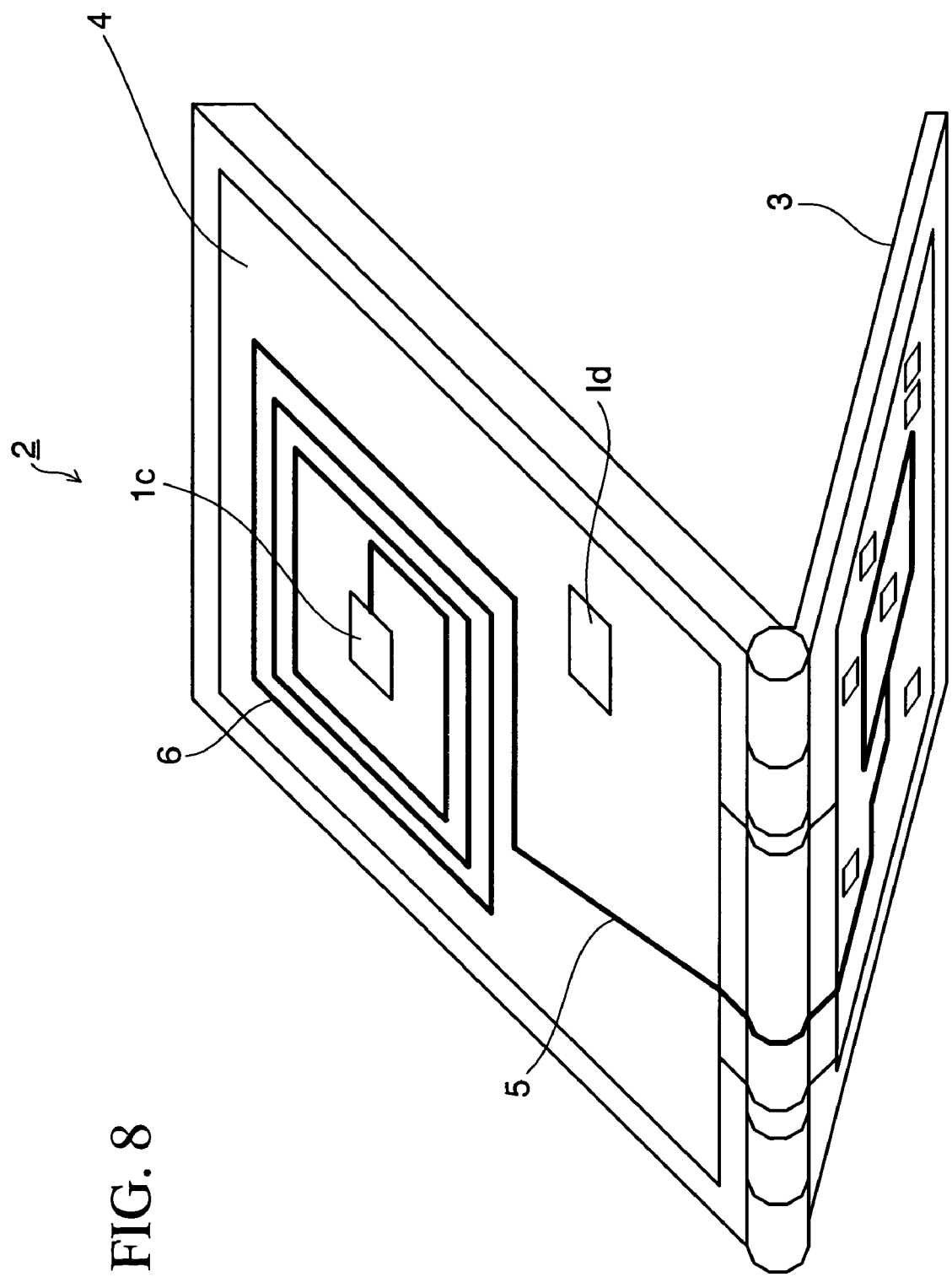
FIG. 8 is a schematic view showing an example in which the electronic parts packaging structure according to the embodiment of the present invention is mounted in an enclosure of a mobile terminal device.

An example in which the electronic parts packaging structure according to the present embodiment is connected to an antenna provided to the enclosure of the mobile terminal device is shown in FIG. 8. Through the rapid spread of the mobile terminal devices such as the cellular phone, the mobile information terminal, and the like, a size reduction and a higher performance are required strongly of the antenna that functions as an input/output port of the radio wave. The electronic parts packaging structure 1c of the present embodiment can be mounted in the enclosure (the case, the frame, or the like) of the mobile terminal device without particular preparation of the mounting substrate.

As shown in FIG. 8, a mounting substrate (not shown) is provided in a first enclosure 3 of a mobile terminal device 2, and an antenna 6 is provided to a second enclosure 4 via a wiring 5 connected to the mounting substrate. If the wiring layer 42 on the mounted body, explained in FIG. 6 and FIG. 7 as above, is provided to the connection portion of the antenna 6, the electronic parts packaging structure 1c can be easily connected electrically to the connecting portion such as the antenna 6 of the mobile terminal device 2. The electronic parts packaging structure 1c is fixed to the second enclosure 4 by the screwing, the hook connection, the caulking connection, the solder jointing, or the like to utilize the fixing holes 48 (FIG. 5) provided in the electronic parts packaging structure 1c. The enclosures 3, 4 of the mobile terminal device 2 may be formed of the rigid substrate or the flexible substrate.

In the prior art, the mounting substrate is provided in the first enclosure 3 of the mobile terminal device 2, and the electronic parts are mounted collectively on the mounting substrate. However, in the electronic parts packaging structure 1c of the present embodiment, there is no need to mount it on the mounting substrate of the mobile terminal device 2, and the electronic parts packaging structure 1c can be mounted on desired portions of the enclosures 3, 4. Therefore, the mounting substrate can be cut and a miniaturization of the electronic device can be attained.

Also, various electronic parts such as the capacitor, and the like except the semiconductor chip 20 may be mounted in the electronic parts packaging structure 1c of the present embodiment. An electronic parts packaging structure 1d formed of the capacitor parts, in which the capacitor is buried in the first and second insulating layers made similarly of a polyimide resin, or the like, is mounted on the second enclosure 4 of the mobile terminal device 2 in FIG. 8. Then, the electronic parts packaging structure 1d is connected electrically to the wiring layers (not shown) in the second enclosure 4 of the mobile terminal device 2 by the above plug-in mounting.

With this arrangement, the antenna can be fixed to the enclosure of the mobile terminal device and therefore a small RF module or a small IC tag can be manufactured. In addition, a reduction in size and thickness of the communication device for use in the radio LAN or Bluetooth (short-distance wireless communication) can be achieved.

Figure 9:
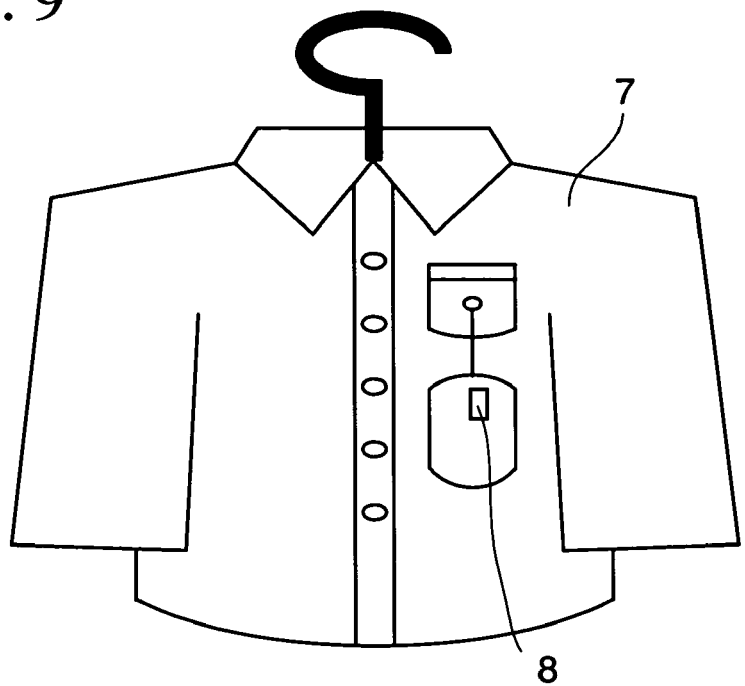
FIG. 9 is a view (#1) showing an example in which the electronic parts packaging structure according to the embodiment of the present invention is applied to an IC tag.
Figure 10:
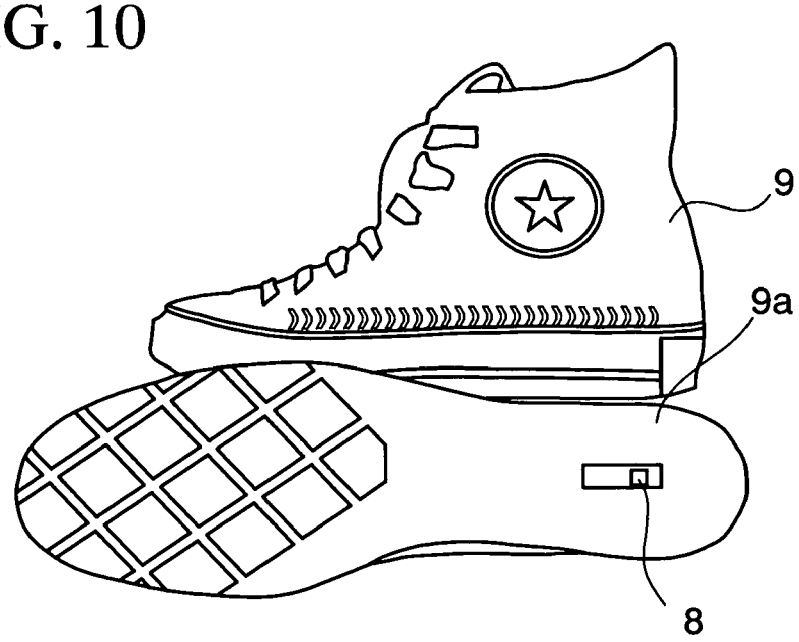
FIG. 10 is a view (#2) showing an example in which the electronic parts packaging structure according to the embodiment of the present invention is applied to the IC tag.

An example in which the electronic parts packaging structure according to the present embodiment is applied to an IC tag is shown in FIG. 9 and FIG. 10.

As shown in FIG. 9, there is an approach of executing a distribution management, and the like by attaching an IC tag 8 to clothes 7. Also, as shown in FIG. 10, there is an approach of executing a distribution management of shoes 9 by inserting the IC tag 8 into a shoe sole 9a. In this case, the IC tag 8 is embedded in right and left heel portions when a main body of the shoes 9 and the rubber shoe sole 9a are bonded by the heating.

In this manner, if the IC tag 8 fitted to the clothes 7 or embedded in the shoe sole 9a is formed of the electronic parts packaging structure of the present embodiment, the IC tag can be manufactured with good reliability at a low cost.

Figure 11:
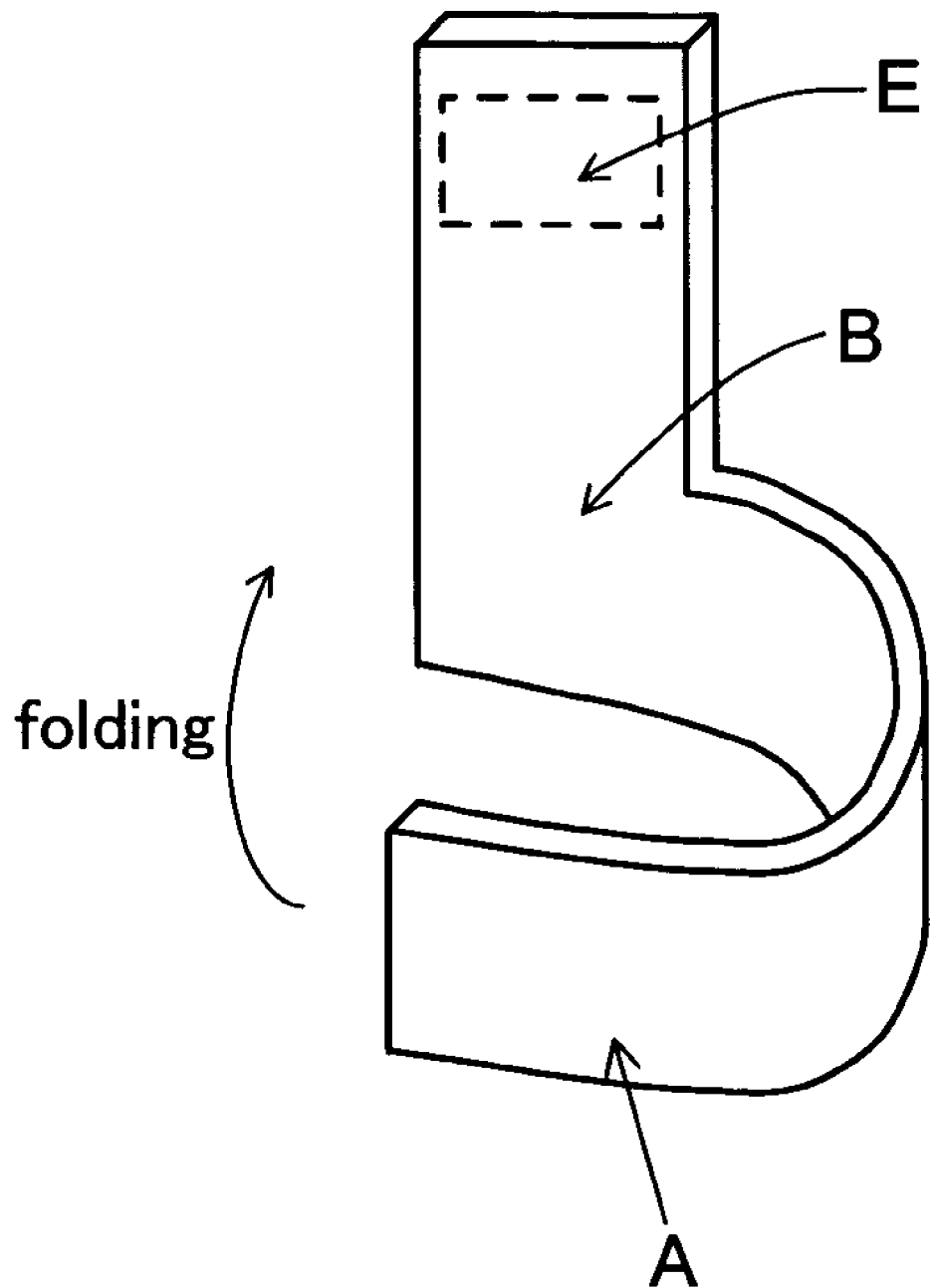
FIG. 11 is a perspective view showing an example of a method of mounting a folding type electronic parts packaging structure according to the second embodiment of the present invention.

Also, an example of the method of mounting the folding type electronic parts packaging structure explained in the above second embodiment is shown in FIG. 11. As explained in the second embodiment, the second mounting area B is folded onto the first mounting area A to overlap with each other, and external connecting terminals (not shown) connected electrically to a plurality of semiconductor chips are provided in an external connection area E. In this case, the above external connection terminals 34 in FIG. 3N are provided to the end portions of the wiring layers that extend from the through holes S to the external connection area E. Then, the external connection terminals are connected electrically to the wiring layer provided to the enclosure of the electronic device by the plug-in mounting explained in FIG. 6 and FIG. 7.

Fourth Embodiment

FIGS. 12A to 12F are sectional views showing a method of manufacturing an electronic parts packaging structure according to a fourth embodiment of the present invention. The fourth embodiment shows a mode in which a plurality of semiconductor chips and capacitor parts are mounted to be cover with the insulating layer. In the fourth embodiment, detailed explanation of the same steps as those in the first to third embodiments will be omitted herein.

Figure 12A:
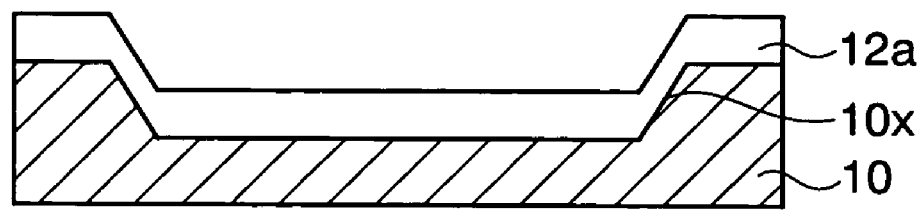
FIGS. 12A to 12F are sectional views showing a method of manufacturing an electronic parts packaging structure according to a fourth embodiment of the present invention.
Figure 12B:
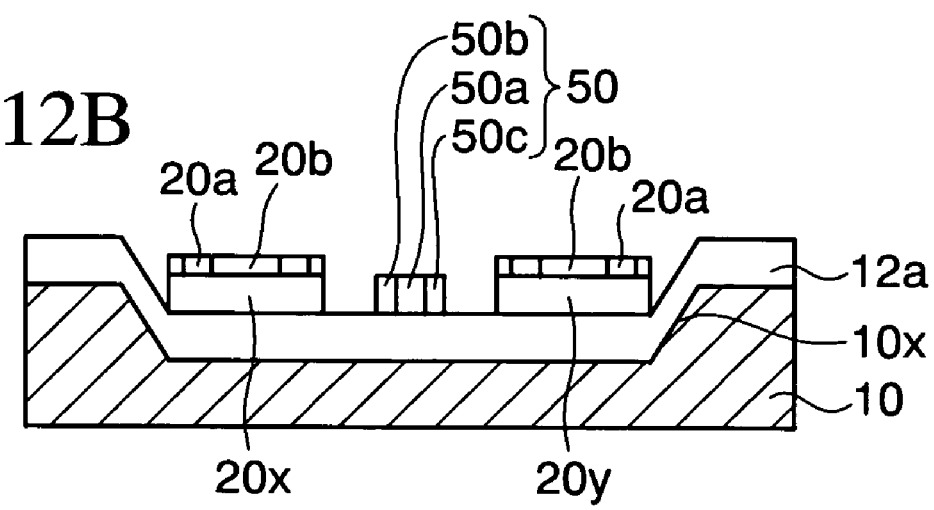

First, as shown in FIG. 12A, like the first embodiment, the semi-cured resin film 12a is pasted onto the metal plate 10 in which the cavity 10x is provided. Then, as shown in FIG. 12B, the first and second semiconductor chips 20x, 20y (electronic parts) similar to the first embodiment are prepared, and then the first and second semiconductor chips 20x, 20y are arranged on the resin film 12a in the cavity 10x of the metal plate 10 respectively to direct their connection pads 20a upward. Then, a capacitor parts 50 (electronic parts) having the structure that a dielectric body 50a is put between a first electrode 50b and a second electrode 50c is prepared. Then, the capacitor parts 50 is arranged on the first insulating layer 12 between the first and second semiconductor chips 20x, 20y such that the first electrode 50b and a second electrode 50c are directed in the horizontal direction.

Figure 12C:
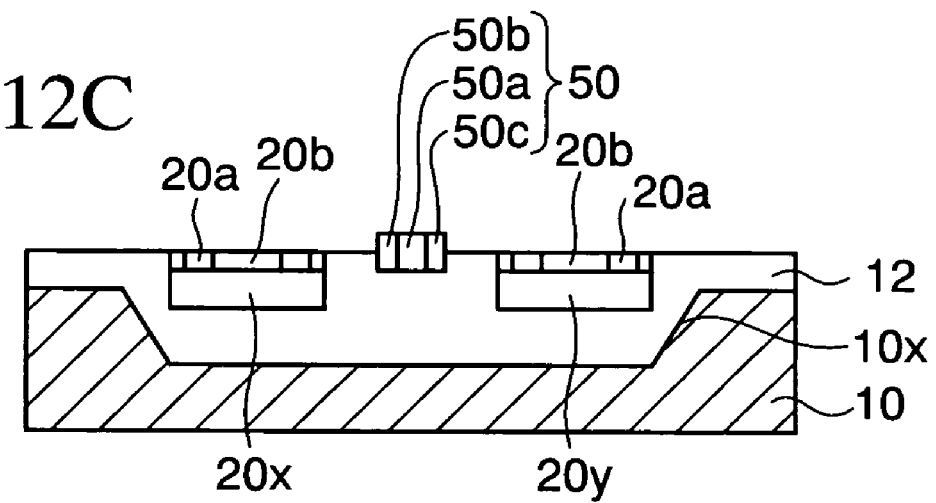

Then, as shown in FIG. 12C, like the first embodiment, the heat press is applied to the semi-cured resin film 12a to cure in its fluidized state. Thus, the first insulating layer 12 for filling the level difference of the first and second semiconductor chips 20x, 20y is obtained. At this time, the structure in FIG. 12B is thermally pressed such that a lower portion of the capacitor parts 50 is buried partially in the first insulating layer 12. Accordingly, the first and second semiconductor chips 20x, 20y and the capacitor parts 50 are adhered onto the first insulating layer 12 without use of the adhesive layer.

Figure 12D:
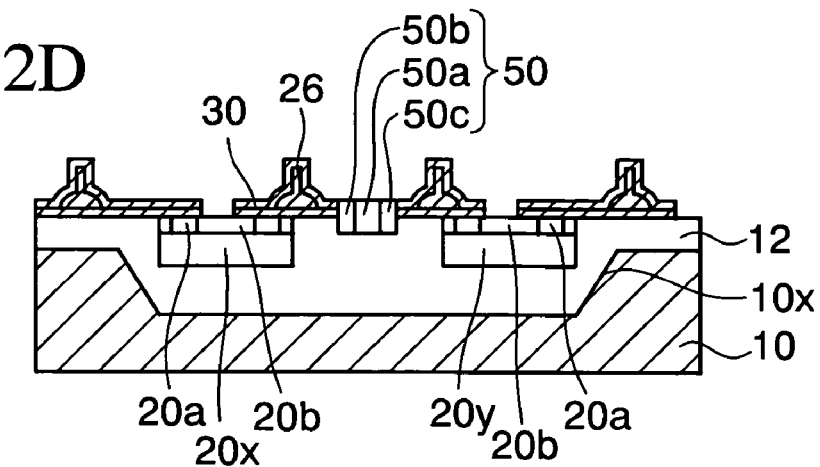

Then, as shown in FIG. 12D, the wiring layer 30 connected to the connection pads 20a of the first and second semiconductor chips 20x, 20y and the first and second electrodes 50b, 50c of the capacitor parts 50 and the bumps 26 connected thereto are formed by the same method as the wiring forming method explained in the second embodiment. For example, the capacitor parts 50 is connected between power supply lines and a ground line of the first and second semiconductor chips 20x, 20y and acts as the decoupling capacitor.

Figure 12E:
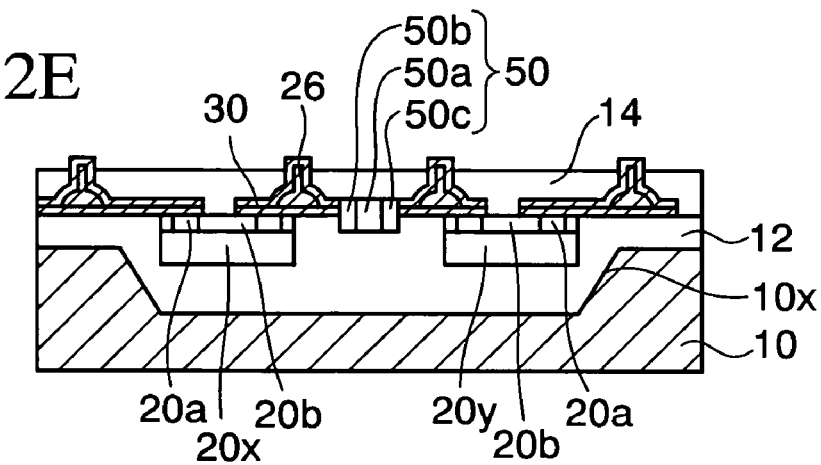
Figure 12F:
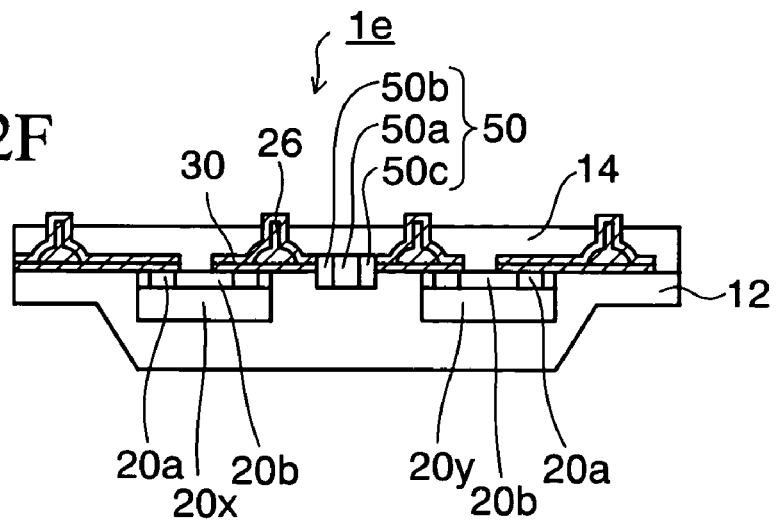

Then, as shown in FIG. 12E, the second insulating layer 14 for covering the first and second semiconductor chips 20x, 20y and the capacitor parts 50 is formed such that the top end portions of the bumps 26 are exposed. Then, as shown in FIG. 12F, the metal plate 10 is removed selectively from the first insulating layer 12. In this case, the wiring layer and the external connection terminals may be provided by the wiring forming method in the first embodiment.

As a result, an electronic parts packaging structure 1e of the fourth embodiment can be obtained. As shown in FIG. 12F, in the electronic parts packaging structure 1e of the fourth embodiment, the first and second semiconductor chips 20x, 20y, the capacitor parts 50, and the wiring layers 30 connected electrically thereto are covered with the first and second insulating layers 12, 14 (the polyimide resin, or the like) and mounted, and the bumps 26 connected to the wiring layers 30 are provided to protrude from the upper surface of the second insulating layer 14.

The electronic parts packaging structure 1e of the fourth embodiment shows a mode in which the whole of a plurality of semiconductor chips and the capacitor parts are covered with the insulating layer that functions as the flexible substrate, and can achieve the similar advantages to the first embodiment. In addition to this, since the wiring layers can be connected to the capacitor parts and be mounted by the photolithography, the present embodiment can respond easily to a miniaturization (e.g., 4×2 mm or less) of the capacitor parts. In the prior art, when the capacitor parts is miniaturized, it is extremely difficult to mount such capacitor parts since the capacitor parts is mounted directly onto the circuit substrate by the solder.

In the above mode, two semiconductor chips and one capacitor parts are covered with the insulating layer and mounted. But the number of the semiconductor chips and the capacitor parts can be set arbitrarily. Also, a plurality of semiconductor chips may be covered with the insulating layer by omitting the capacitor parts. Also, various electronic elements except the semiconductor chips and the capacitor parts may be mounted with plural by the similar constitution.

Fifth Embodiment

FIGS. 13A to 13F are sectional views showing a method of manufacturing an electronic parts packaging structure according to a fifth embodiment of the present invention. The fifth embodiment shows a mode in which a plurality of semiconductor chips and the chip capacitor are covered with the insulating layer and mounted. In the fifth embodiment, detailed explanation of the same steps as those in the first to third embodiments will be omitted.

Figure 13A:
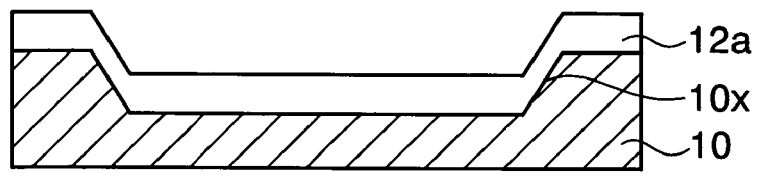
FIGS. 13A to 13F are sectional views showing a method of manufacturing an electronic parts packaging structure according to a fifth embodiment of the present invention.
Figure 13B:
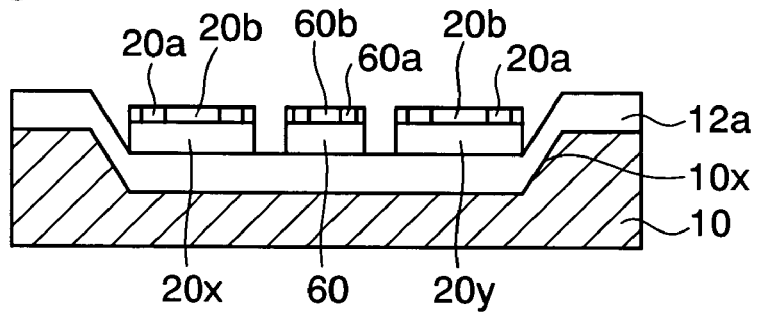

First, as shown in FIG. 13A, the semi-cured resin film 12a is pasted onto the metal plate 10 in which the cavity 10x is provided. Then, as shown in FIG. 13B, the first and second semiconductor chips 20x, 20y (electronic parts) similar to the first embodiment and a chip capacitor 60 (electronic parts) having a structure that a capacitor is formed on the silicon substrate and a connection pad 60a and a passivation film 60b are exposed from its upper side are prepared.

Then, the first and second semiconductor chips 20x, 20y are arranged on the resin film 12a in the cavity 10x of the metal plate 10 to direct their connection pads 20a upward. Also, the chip capacitor 60 is arranged on the resin film 12a between the first and second semiconductor chips 20x, 20y to direct the connection pad 60a upward.

Figure 13C:
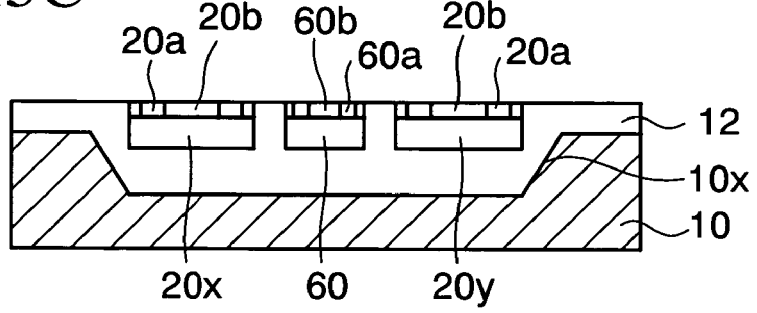

Then, as shown in FIG. 13C, like the first embodiment, the heat press is applied to the semi-cured resin film 12a to cure it in its fluidized state. Thus, the first insulating layer 12 for filling a level difference on the first and second semiconductor chips 20x, 20y and the chip capacitor 60 is obtained. Accordingly, the first and second semiconductor chips 20x, 20y and the chip capacitor 60 can be adhered onto the first insulating layer 12.

Figure 13D:
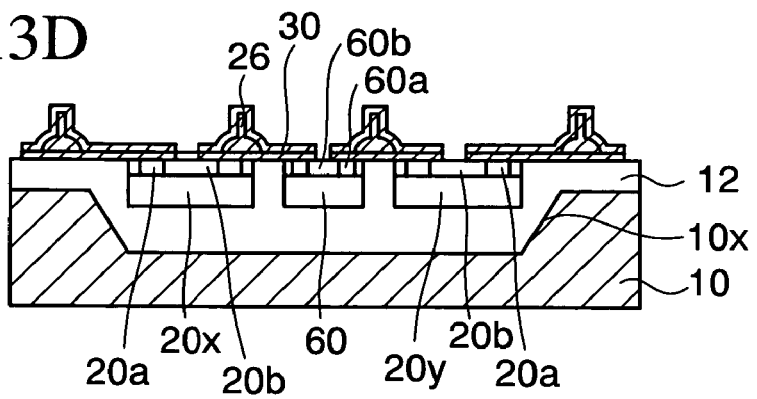

Then, as shown in FIG. 13D, the wiring layers 30 connected electrically to the connection pads 20a of the first and second semiconductor chips 20x, 20y and the connection pad 60a of the chip capacitor 60 and the bumps 26 connected thereto are formed by the similar method to the wiring forming method explained in the second embodiment.

Figure 13E:
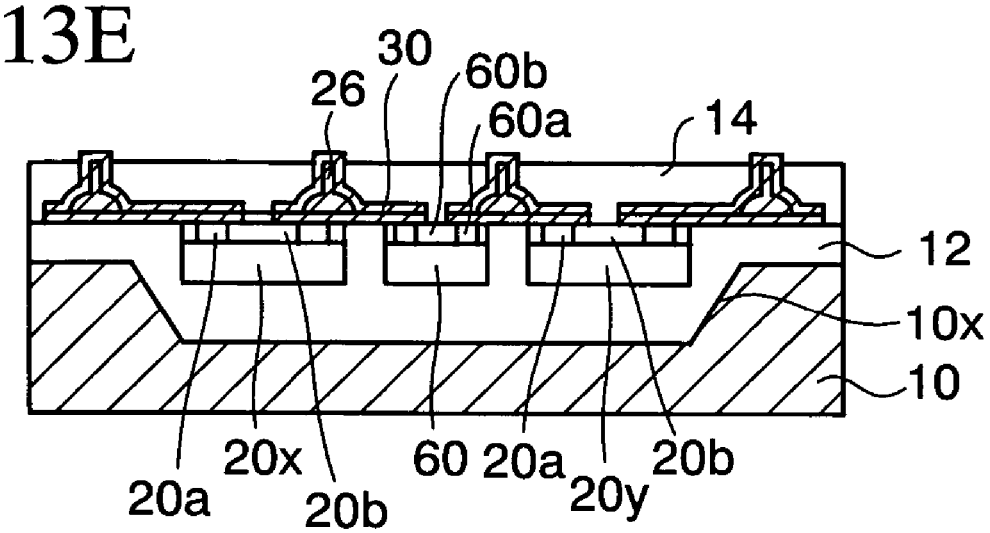
Figure 13F:
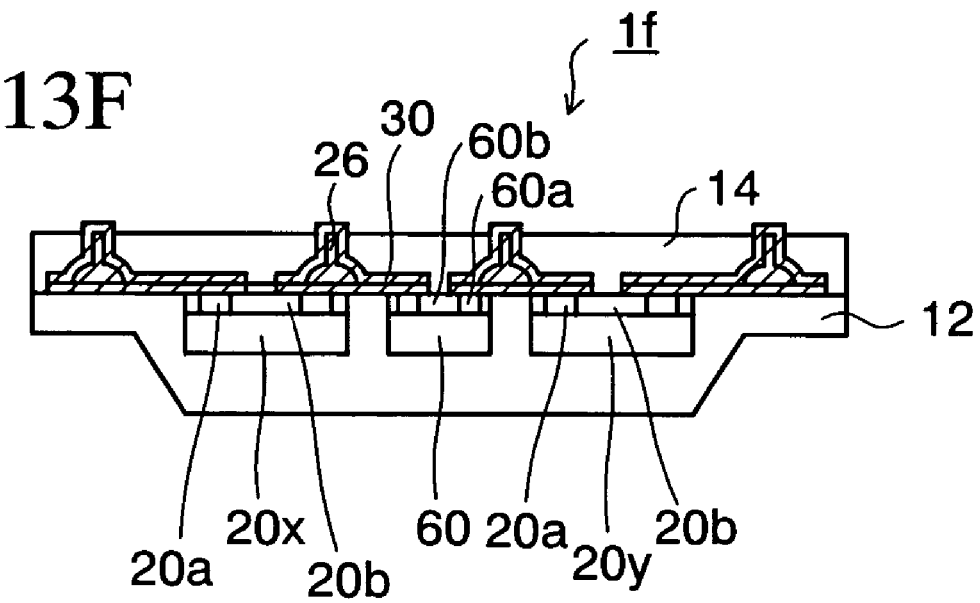

Then, as shown in FIG. 13E, the second insulating layer 14 for covering the first and second semiconductor chips 20x, 20y, the chip capacitor 60, and the wiring layers 30 is formed to expose the top end sides of the bumps 26. Then, as shown in FIG. 13F, the metal plate 10 is removed selectively from the first insulating layer 12.

With the above, an electronic parts packaging structure 1f of the fifth embodiment can be obtained. As shown in FIG. 13F, in the electronic parts packaging structure 1f of the fifth embodiment, the first and second semiconductor chips 20x, 20y, the chip capacitor 60 and the wiring layers 30 connected to them are covered with the first and second insulating layers 12, 14 (the polyimide resin, or the like) acting as the flexible substrate and mounted, and the bumps 26 connected to the wiring layers 30 are provided to project from the upper surface of the second insulating layer 14.

The electronic parts packaging structure 1f of the fifth embodiment shows a mode in which the whole of a plurality of semiconductor chips and the chip capacitor are covered with the insulating layer that functions as the flexible substrate, and can achieve the similar advantages to the first embodiment.

Sixth Embodiment

FIGS. 14A to 14F are sectional views showing a method of manufacturing an electronic parts packaging structure according to a sixth embodiment of the present invention. In the sixth embodiment, detailed explanation of the same steps as those in the first to third embodiments will be omitted.

Figure 14A:
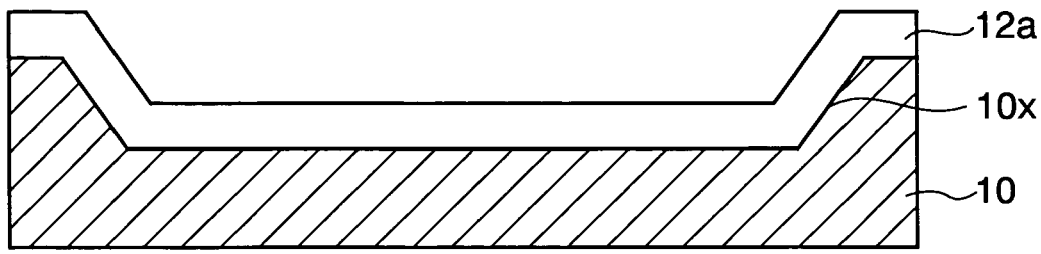
FIGS. 14A to 14F are sectional views showing a method of manufacturing an electronic parts packaging structure according to a sixth embodiment of the present invention.
Figure 14B:
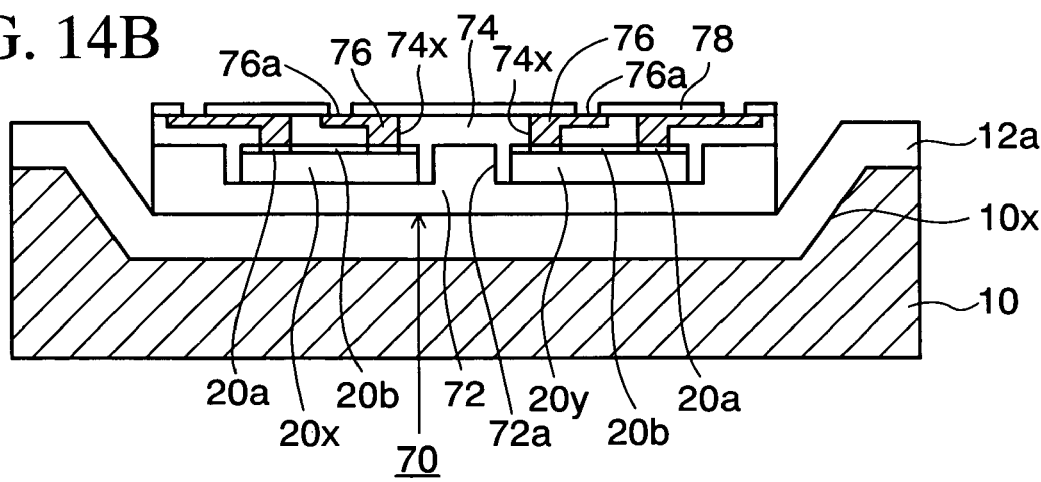

First, as shown in FIG. 14A, the semi-cured resin film 12a is pasted onto the metal plate 10 in which the cavity 10x is provided. Then, as shown in FIG. 14B, a module parts 70 (electronic parts) is prepared. In the present embodiment, a MCM (Multi Chip Module) in which a plurality of semiconductor chips are mounted on the substrate as a module is exemplified. In the module parts 70 of the present embodiment, a cavity 72a is provided on a silicon substrate 72 and the first and second semiconductor chips 20x, 20y are mounted on the bottom portion of the cavity 72a. The first and second semiconductor chips 20x, 20y have the connection pads 20a and the passivation film 20b on the upper surface side respectively. Then, an insulating layer 74 for covering the first and second semiconductor chips 20x, 20y is formed on the silicon substrate 72. Also, via holes 74x are formed in portions of the insulating layer 74 on the connection pads 20a of the first and second semiconductor chips 20x, 20y respectively. A wiring pattern 76 connected electrically to the connection pads 20a of the first and second semiconductor chips 20x, 20y is formed from the via hole 74x to an upper surface side of the insulating layer 74 respectively. Then, a protection layer 78 in which opening portions are provided on connection pads 76a of the wiring pattern 76 is formed on the insulating layer 74.

As the module parts 70, in addition to the above example, a module in which various electronic elements (active elements and passive elements) are mounted with plural on the substrate can be employed.

Figure 14C:
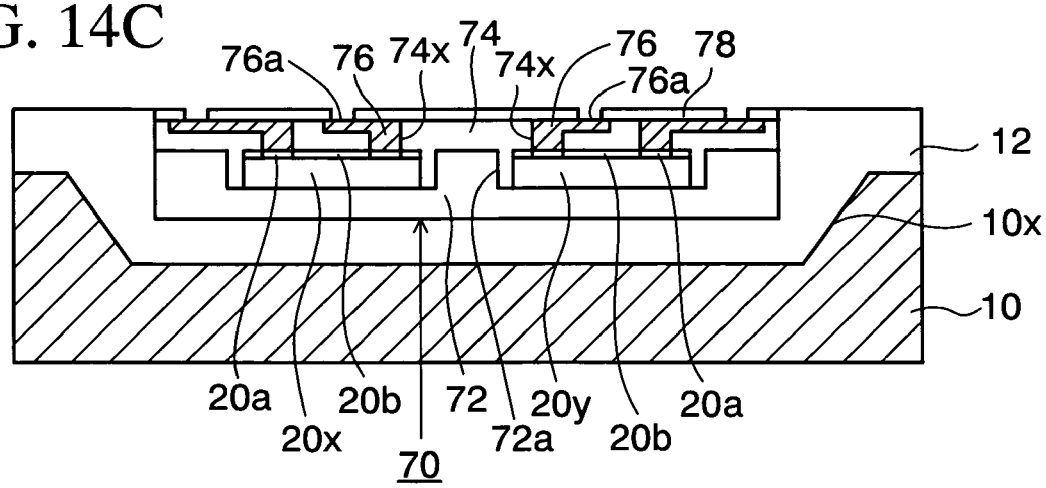

Then, as also shown in FIG. 14B, such module parts 70 is arranged on the resin film 12a in the cavity 10x of the metal plate 10 to direct the wiring pattern 76 upward. Then, as shown in FIG. 14C, like the first embodiment, the heat press is applied to the semi-cured resin film 12a to cure it in its fluidized state, and thus the first insulating layer 12 for filling a level difference of the module parts 70 can be obtained. Accordingly, the module parts 70 is adhered to the first insulating layer 12.

Figure 14D:
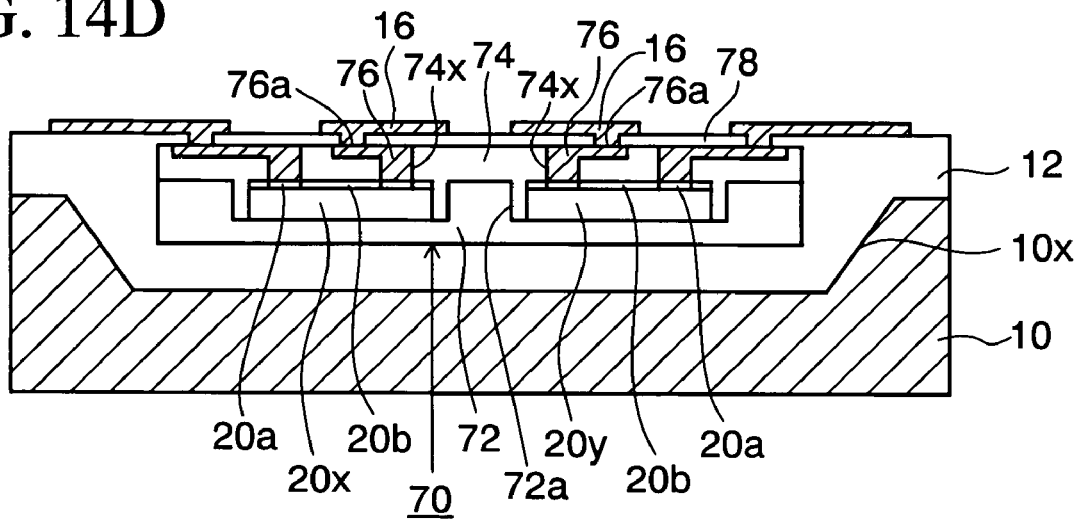

Then, as shown in FIG. 14D, the wiring layer 16 connected electrically to the connection pads 76a of the wiring pattern 76 in the module parts 70 is formed on the module parts 70 and the first insulating layer 12 by the semi-additive process similar to the first embodiment.

Figure 14E:
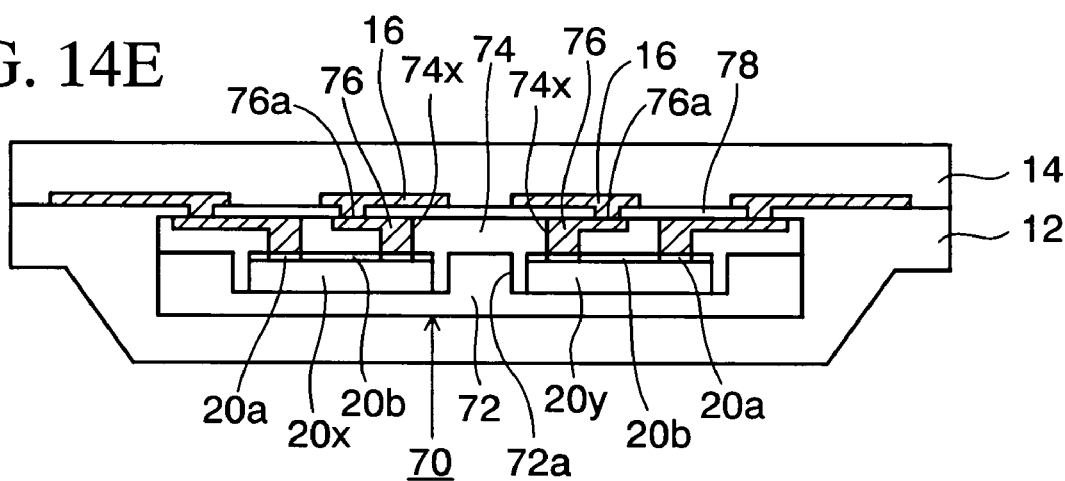

Then, as shown in FIG. 14E, the second insulating layer 14 for covering the wiring layer 16 and the module parts 70 is formed. Then, the metal plate 10 is removed selectively from the first insulating layer 12.

Figure 14F:
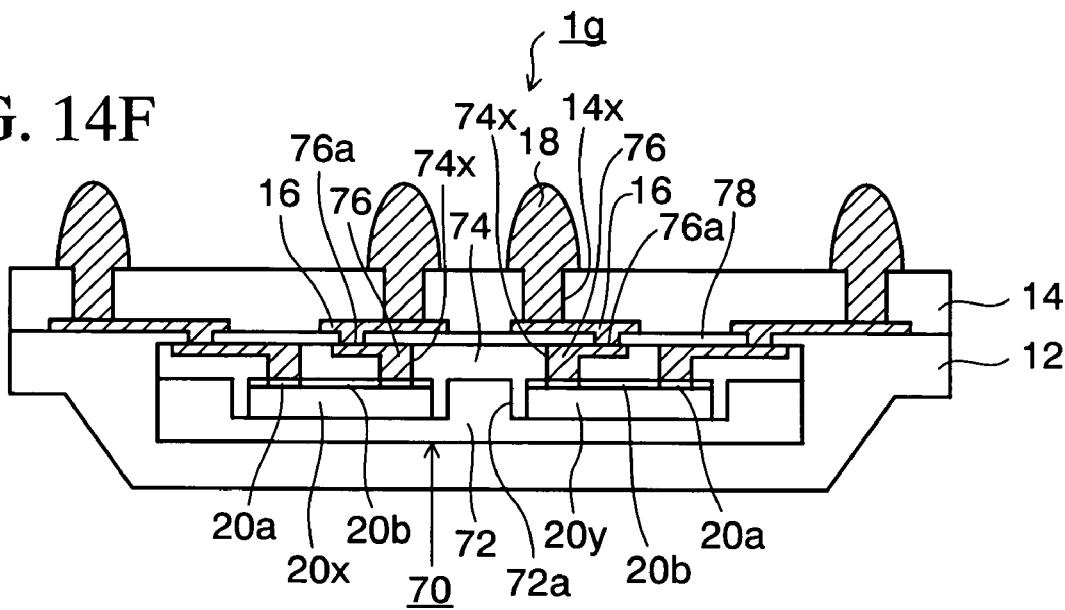

Then, as shown in FIG. 14F, the via holes 14x each having a depth that reaches the upper surface of the wiring layer 16 are formed by processing the second insulating layer 14 by the laser, or the like. Then, the external connection terminals 18 connected to the wiring layer 16 to protrude from the second insulating layer 14 are formed by mounting the solder ball in the via holes 14x, or the like. In this case, the via holes may be formed in the first insulating layer 12 and the external connection terminals may be provided under the wiring layer 16. Also, the wiring layer and the bumps may be formed by the wiring method in the second embodiment.

With the above, an electronic parts packaging structure 1g of the sixth embodiment can be obtained. The electronic parts packaging structure 1g of the sixth embodiment shows a mode in which the whole of module parts 70 constructed by mounting a plurality of semiconductor chips, and the like on the substrate is covered with the first and second insulating layers 12, 14 acting as the flexible substrate and mounted, and can achieve the similar advantages to the first embodiment. In this case, a combination of the module parts 70 and individual semiconductor chips or the capacitors, etc. may be similarly covered with the insulating layer and may be mounted.

What is claimed is:
1. An electronic parts packaging structure comprising:
an insulating layer acting as a flexible substrate, and formed of resin made of an identical material over the whole;
electronic parts buried in the insulating layer in a state that a whole of the electronic parts is covered with the insulating layer;
a wiring layer buried in the insulating layer and connected electrically to a connection pad of the electronic parts, and extending outwardly from on the electronic parts; and
a connection terminal provided to protrude from an outer surface of the insulating layer over or under the wiring layer, and connected electrically to the wiring layer, and formed at one end side of the wiring pattern outside the electronic parts, and arranged excluding a center portion in the electronic parts,
wherein the insulating layer is composed of a first insulating layer and a second insulating layer made of same material, and the electronic parts are arranged between the first insulating layer and the second insulating layer in a state such that the connection pad of the electronic parts is directed upward.

2. The electronic parts packaging structure, according to claim 1, wherein the electronic parts are buried in the underlying first insulating layer such that a level difference of the electronic parts is planarized.

3. An electronic parts packaging structure, according to claim 1, wherein the insulating layer is formed of any one selected from a group consisting of a polyimide resin, an epoxy resin, a polyurethane resin, an acrylic resin, and a silicon resin.

4. An electronic parts packaging structure, according to claim 1, wherein the electronic parts is any one selected from a group consisting of a semiconductor chip, a capacitor, and a module parts constructed by mounting a plurality of electronic parts on a substrate, or a combination of two above elements or more.

5. An electronic parts packaging structure comprising:
an insulating layer acting as a flexible substrate, and formed of resin made of an identical material over the whole;
electronic parts buried in the insulating layer in a state that a whole of the electronic parts is covered with the insulating layer;
a wiring layer buried in the insulating layer and connected electrically to a connection pad of the electronic parts, and extending outwardly from on the electronic parts; and
a connection terminal provided to protrude from an outer surface of the insulating layer over or under the wiring layer, and connected electrically to the wiring layer, and formed at one end side of the wiring pattern outside the electronic parts, and arranged excluding a center portion in the electronic parts,
wherein packaging structures in which a plurality of said electronic parts are mounted on a plurality of mounting areas of the insulating layer respectively are folded such that the mounting areas overlap with each other and the upper and the lower electronic parts are connected electrically to each other.

6. An electronic parts packaging structure, according to claim 5, wherein, in the mounting areas which are folded and overlap mutually,
in one mounting area, a bump as the connection terminal is formed at the wiring layer connected to the electronic parts,
and in other mounting area, a through hole from which the wiring layer connected to the electronic parts is exposed on a side surface is formed, and upon folding the electronic parts packaging structure, the bump in the one mounting area is inserted into the through hole in the other mounting area, and an external connection terminal connected electrically to the wiring layers of upper and lower electronic parts respectively is provided on the other mounting area side though the through hole.

* * * * *